US010635004B2

(12) United States Patent
Jiang et al.

(10) Patent No.: US 10,635,004 B2
(45) Date of Patent: Apr. 28, 2020

(54) CORRECTION USING STACK DIFFERENCE

(71) Applicant: ASML NETHERLANDS B.V., Veldhoven (NL)

(72) Inventors: Aiqin Jiang, Schenectady, NY (US); Arie Jeffrey Den Boef, Waalre (NL); Kaustuve Bhattacharyya, Veldhoven (NL); Hans Van Der Laan, Veldhoven (NL); Bart Visser, Eindhoven (NL); Martin Jacobus Johan Jak, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 231 days.

(21) Appl. No.: 15/808,874

(22) Filed: Nov. 9, 2017

(65) Prior Publication Data
US 2018/0129139 A1 May 10, 2018

Related U.S. Application Data

(60) Provisional application No. 62/420,375, filed on Nov. 10, 2016.

(51) Int. Cl.
*G03F 7/20* (2006.01)
*G05B 19/406* (2006.01)
*H01L 21/66* (2006.01)

(52) U.S. Cl.
CPC .......... *G03F 7/70516* (2013.01); *G03F 7/705* (2013.01); *G03F 7/70508* (2013.01);
(Continued)

(58) Field of Classification Search
CPC .. G03F 7/70516; G03F 7/70508; G03F 7/705; G05B 2219/45028; G05B 19/406
(Continued)

(56) References Cited

U.S. PATENT DOCUMENTS 9,470,639 B1 10/2016 Zhuang et al.
9,704,810 B2 7/2017 Den Boef
(Continued)

FOREIGN PATENT DOCUMENTS

TW 201506554 2/2015
TW I634321 9/2018
(Continued)

OTHER PUBLICATIONS

Notification of Transmittal of the International Search Report and the Written Opinion of the International Searching Authority dated Mar. 28, 2018, in corresponding International Patent Application No. PCT/EP2017/078716.
(Continued)

*Primary Examiner* — Sun J Lin
(74) *Attorney, Agent, or Firm* — Pillsbury Winthrop Shaw Pittman LLP

(57) ABSTRACT

A method including obtaining a fit of data for overlay of a metrology target for a patterning process as a function of a stack difference parameter of the metrology target; and using, by a hardware computer, a slope of the fit (i) to differentiate a metrology target measurement recipe from another metrology target measurement recipe, or (ii) calculate a corrected value of overlay, or (iii) to indicate that an overlay measurement value obtained using the metrology target should be used, or not be used, to configure or modify an aspect of the patterning process, or (iv) any combination selected from (i)-(iii).

27 Claims, 14 Drawing Sheets

(52) U.S. Cl.
CPC ...... *G03F 7/70633* (2013.01); *G03F 7/70683* (2013.01); *G05B 19/406* (2013.01); *G05B 2219/45028* (2013.01); *H01L 22/12* (2013.01); *H01L 22/20* (2013.01)

(58) Field of Classification Search
USPC .................................................. 716/53, 54
See application file for complete search history.

(56) References Cited

U.S. PATENT DOCUMENTS

| | | |
|---|---|---|
| 2011/0027704 A1 | 2/2011 | Cramer et al. |
| 2011/0043791 A1 | 2/2011 | Smilde et al. |
| 2012/0242970 A1 | 9/2012 | Smilde et al. |
| 2013/0054186 A1 | 2/2013 | Den Boef |
| 2016/0117847 A1 | 4/2016 | Pandev et al. |
| 2016/0161863 A1 | 6/2016 | Den Boef et al. |
| 2016/0161864 A1 | 6/2016 | Middlebrooks et al. |
| 2016/0196379 A1* | 7/2016 | Adel et al. ............... G03F 1/36 716/52 |
| 2016/0313654 A1 | 10/2016 | Zeng et al. |
| 2016/0313658 A1 | 10/2016 | Marciano et al. |
| 2017/0307983 A1* | 10/2017 | Den Boef et al. ............ G01N 21/4788 |

FOREIGN PATENT DOCUMENTS

| | | |
|---|---|---|
| WO | 2009/078708 | 6/2009 |
| WO | 2009/106279 | 9/2009 |
| WO | 2011/012624 | 2/2011 |
| WO | 2013/143814 | 10/2013 |

OTHER PUBLICATIONS

Bhattacharyya, Kaustave, et al., "New approaches for scatterometry-based metrology for critical distance and overlay measurement and process control", J. Micro/Nanolith., MEMS and MOEMS vol. 10, No. 1, pp. 013013-1-013013-8 (2011).

Bhattacharyya, Kaustave, et al., "On-product overlay enhancement using advanced litho-cluster control based on integrated metrology, ultra-small DBO targets and novel corrections", Proc. of SPIE, vol. 8681, pp. 868104-1-868104-9 (2013).

Taiwanese Office Action issued in corresponding Taiwanese Patent Application No. 106138876, dated Feb. 19, 2020.

* cited by examiner

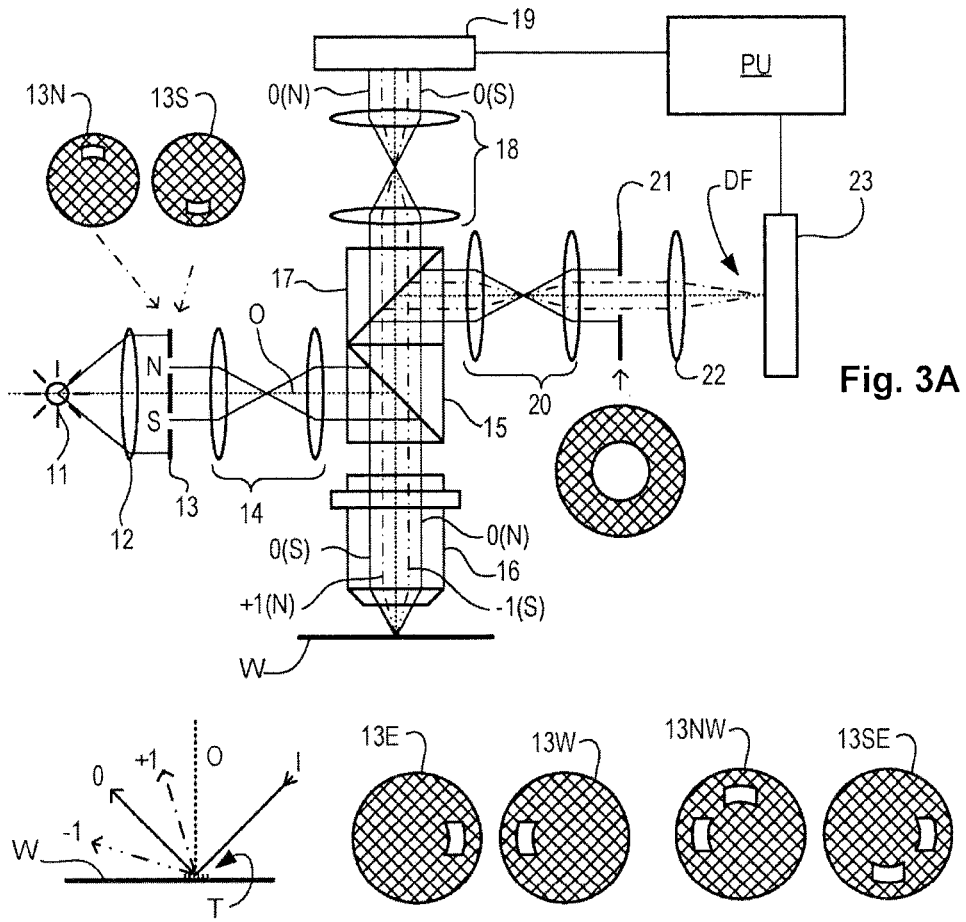
Fig. 3A
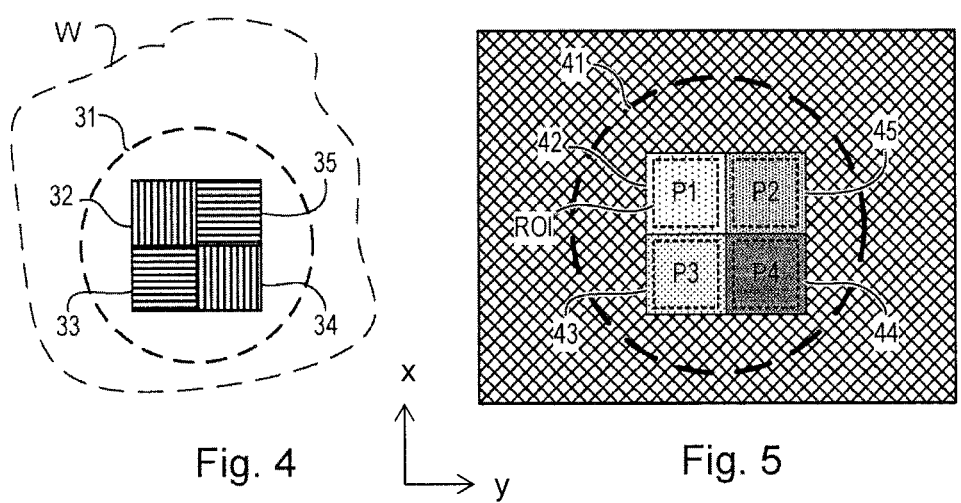
Fig. 3B  Fig. 3C  Fig. 3D
Fig. 4  Fig. 5

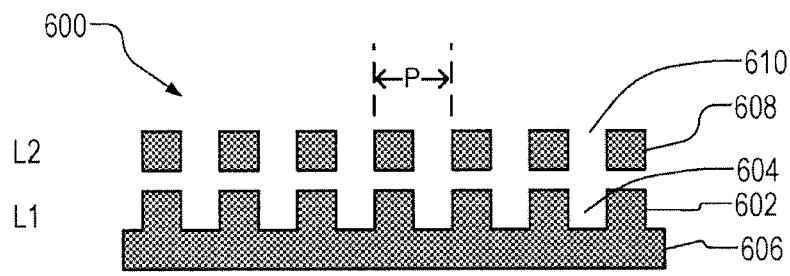
Fig. 7A
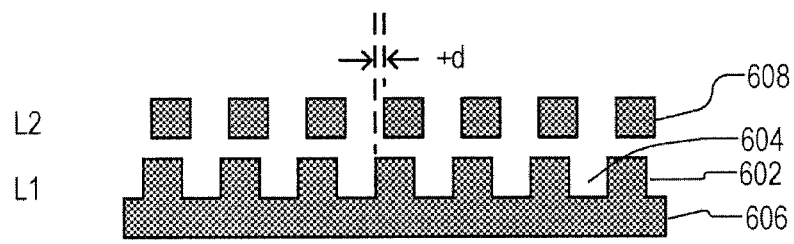
Fig. 7B
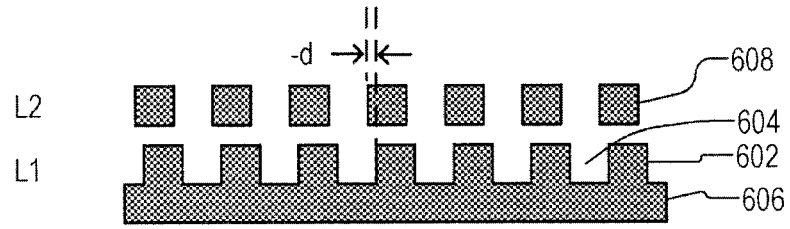
Fig. 7C
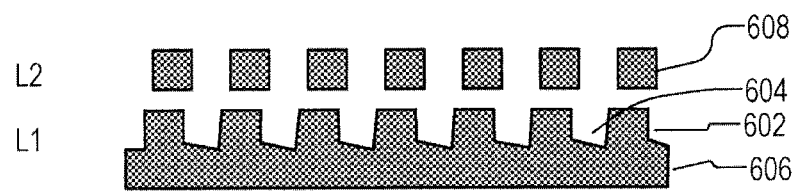
Fig. 7D
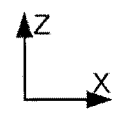

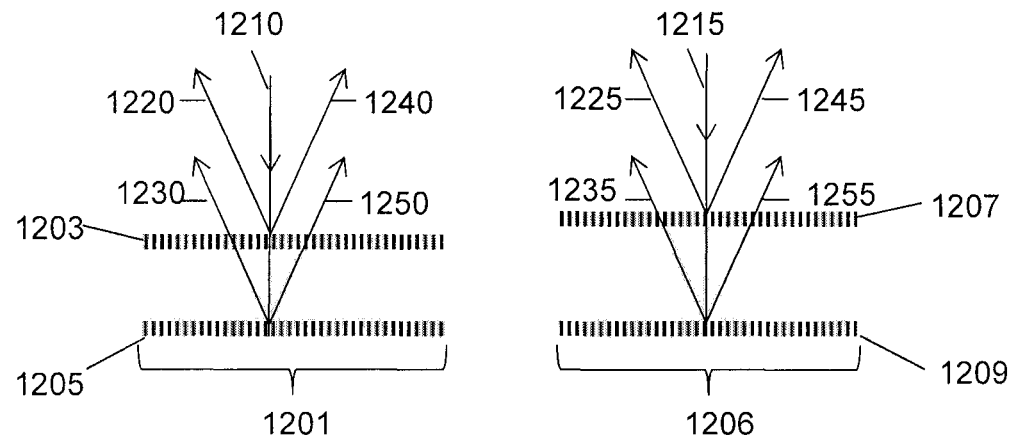
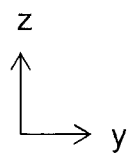
Fig. 11A
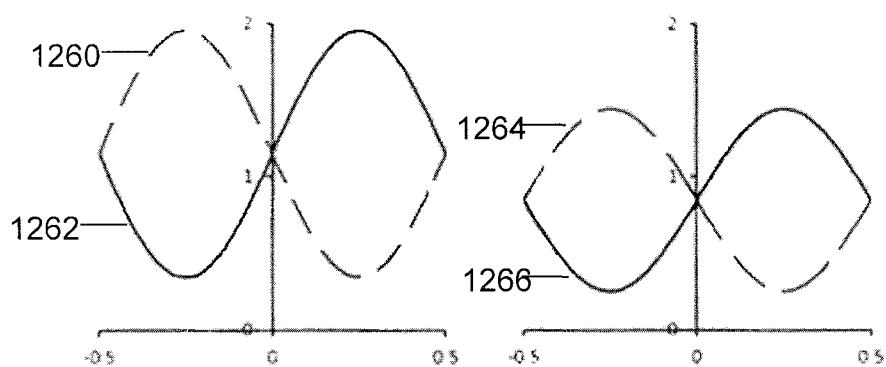
Fig 11B    Fig. 11C

CORRECTION USING STACK DIFFERENCE

This application claims the benefit of priority of U.S. Provisional Patent Application No. 62/420,375, filed Nov. 10, 2016, which is incorporated by reference herein in its entirety.

FIELD

The present disclosure relates to methods and apparatus for inspection (e.g., metrology) usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In a patterning process (i.e., a process of creating a device or other structure involving patterning (such as lithographic exposure or imprint), which may typically include one or more associated processing steps such as development of resist, etching, etc.), it is desirable to determine (e.g., measure, simulate using one or more models that model one or more aspects of the patterning process, etc.) one or more parameters of interest, such as the critical dimension (CD) of a structure, the overlay error between successive layers formed in or on the substrate, etc.

It is desirable to determine such one or more parameters of interest for structures created by a patterning process and use them for design, control and/or monitoring relating to the patterning process, e.g., for process design, control and/or verification. The determined one or more parameters of interest of patterned structures can be used for patterning process design, correction and/or verification, defect detection or classification, yield estimation and/or process control.

Thus, in patterning processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of inspection apparatus (e.g., metrology apparatus) have been developed for use in the lithographic field. These devices direct a beam of radiation onto a target and measure one or more properties of the redirected (e.g., scattered) radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by inspection apparatus (e.g., a scatterometer) are relatively large, e.g., 40 µm by 40 µm, periodic structures (e.g., gratings) and the measurement beam generates a spot that is smaller than the periodic structure (i.e., the periodic structure is underfilled). This simplifies mathematical reconstruction of the target as it can be regarded as infinite. However, in order to reduce the size of the targets, e.g., to 10 µm by 10 µm or less, e.g., so they can be positioned in amongst product features, rather than in the scribe lane, metrology can performed in which the periodic structure is made smaller than the measurement spot (i.e., the periodic structure is overfilled). Typically such targets are measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated by reference in their entirety. Further developments of the technique have been described in U.S. patent application publication nos. US 2011-0027704, US 2011-0043791 and US 2012-0242940, each of which is incorporated herein in its entirety. Diffraction-based overlay using dark-field detection of the diffraction orders enables overlay measurements on smaller targets. These targets can be smaller than the illumination spot and may be surrounded by product structures on a substrate. A target can comprise multiple periodic structures, which can be measured in one image.

In a known metrology technique, overlay measurement results are obtained by measuring a target twice under certain conditions, while either rotating the target or changing the illumination mode or imaging mode to obtain separately the $-1^{st}$ and the $+1^{st}$ diffraction order intensities. The intensity asymmetry, a comparison of these diffraction order intensities, for a given target provides a measurement of target asymmetry, that is asymmetry in the target. This asymmetry in the target can be used as an indicator of overlay error (undesired misalignment of two layers).

SUMMARY

Although, in the example of overlay measurement, the overlay measurements are fast and computationally very simple (once calibrated), they rely on an assumption that overlay (i.e., overlay error and deliberate bias) is the only cause of target asymmetry in the target. Any other asymmetry in the target, such as structural asymmetry of features within the periodic structure in an upper layer, within the periodic structure in a lower layer overlaid by the periodic structure in the upper layer, or both, also causes an intensity asymmetry in the $1^{st}$ (or other higher) orders. This intensity asymmetry attributable to structural asymmetry, and which is not related to overlay, perturbs the overlay measurement, giving an inaccurate overlay measurement. Asymmetry in the lower or bottom periodic structure of a target is a common form of structural asymmetry. It may originate for example in substrate processing steps such as chemical-mechanical polishing (CMP), performed after the bottom periodic structure was originally formed.

It has been discovered that, in addition to or alternatively to structural asymmetry in a target, a stack difference between adjacent periodic structures of a target or between adjacent targets may be a factor that adversely affects the accuracy of measurement, such as overlay measurement. Stack difference may be understood as an un-designed difference in physical configurations between adjacent periodic structures or targets. Stack difference includes, but is not limited to, a thickness difference between the adjacent periodic structures or targets, a refractive index difference between the adjacent periodic structures or targets, a difference in material between the adjacent periodic structures or targets, a difference in the grating period of the structures of adjacent periodic structures or targets, etc. Like structural asymmetry, the stack difference may be introduced by processing steps, such as CMP, layer deposition, etc. in the patterning process.

Therefore, it is desired to use determined stack difference to identify one or more desired metrology target measurement recipes (e.g., a particular desired target design and/or one or more particular measurement parameters (such as measurement beam wavelength and/or polarization)). Additionally or alternatively, it is desired to be able to determine overlay using determined stack difference.

In an embodiment, there is provided a method comprising: obtaining a fit of data for overlay of a metrology target for a patterning process as a function of a stack difference parameter of the metrology target; and using, by a hardware computer, a slope of the fit (i) to differentiate a metrology target measurement recipe from another metrology target measurement recipe, or (ii) calculate a corrected value of overlay, or (iii) to indicate that an overlay measurement value obtained using the metrology target should be used, or not be used, to configure or modify an aspect of the patterning process, or (iv) any combination selected from (i)-(iii).

In an embodiment, there is provided a method comprising: obtaining a periodic structure intensity imbalance parameter value for a region of a metrology target of a patterning process, the region expected to have least stack difference; finding a non-overlay induced periodic structure intensity imbalance parameter value as a difference between an average periodic structure intensity imbalance parameter value for the metrology target and the periodic structure intensity imbalance parameter value for the region; and using the non-overlay induced periodic structure intensity imbalance parameter difference to calculate a corrected overlay value.

In an embodiment, there is provided a method comprising: obtaining measurement radiation intensity values for a metrology target of a patterning process as a function of a stack difference parameter of the metrology target; obtaining, from the measurement radiation intensity values as a function of the stack difference parameter, values of measurement radiation intensity for determining overlay at a value of non-overlay induced periodic structure intensity imbalance; and determining, by a hardware computer, a value of overlay based on the values of measurement radiation intensity for determining overlay.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which:

FIG. 3A depicts a schematic diagram of an inspection apparatus (e.g., a dark field scatterometer in this case) configured to measure a target using a first pair of illumination apertures;

FIG. 3B schematically depicts a detail of a diffraction spectrum of a target periodic structure for a given direction of illumination;

FIG. 3C schematically depicts a second pair of illumination apertures providing further illumination modes in using the inspection apparatus of FIG. 3A for diffraction based overlay measurements;

FIG. 3D schematically depicts a third pair of illumination apertures combining the first and second pair of apertures;

FIG. 4 depicts a form of multiple periodic structure target and an outline of a measurement spot on a substrate;

FIG. 5 depicts an image of the target of FIG. 4 obtained in the inspection apparatus of FIG. 3;

FIG. 7A, FIG. 7B and FIG. 7C respectively show schematic cross-sections of overlay periodic structures having different overlay values in the region of zero;

FIG. 7D is a schematic cross-section of an overlay periodic structure having structural asymmetry in a bottom periodic structure due to processing effects;

FIG. 11A schematically illustrates a situation where a stack difference exists between a first target periodic structure with a bias +d and a second target periodic structure with a bias −d, and illustrates diffraction signals following diffraction by the first and second target periodic structures;

FIG. 11B and FIG. 11C schematically illustrates intensity variations of the combined $+1^{st}$ diffraction order signal and the combined $-1^{st}$ diffraction order signal diffracted by the first target periodic structure and the second target periodic structure, respectively;

DETAILED DESCRIPTION

Before describing embodiments in detail, it is instructive to present an example environment in which embodiments may be implemented.

Figure 1:
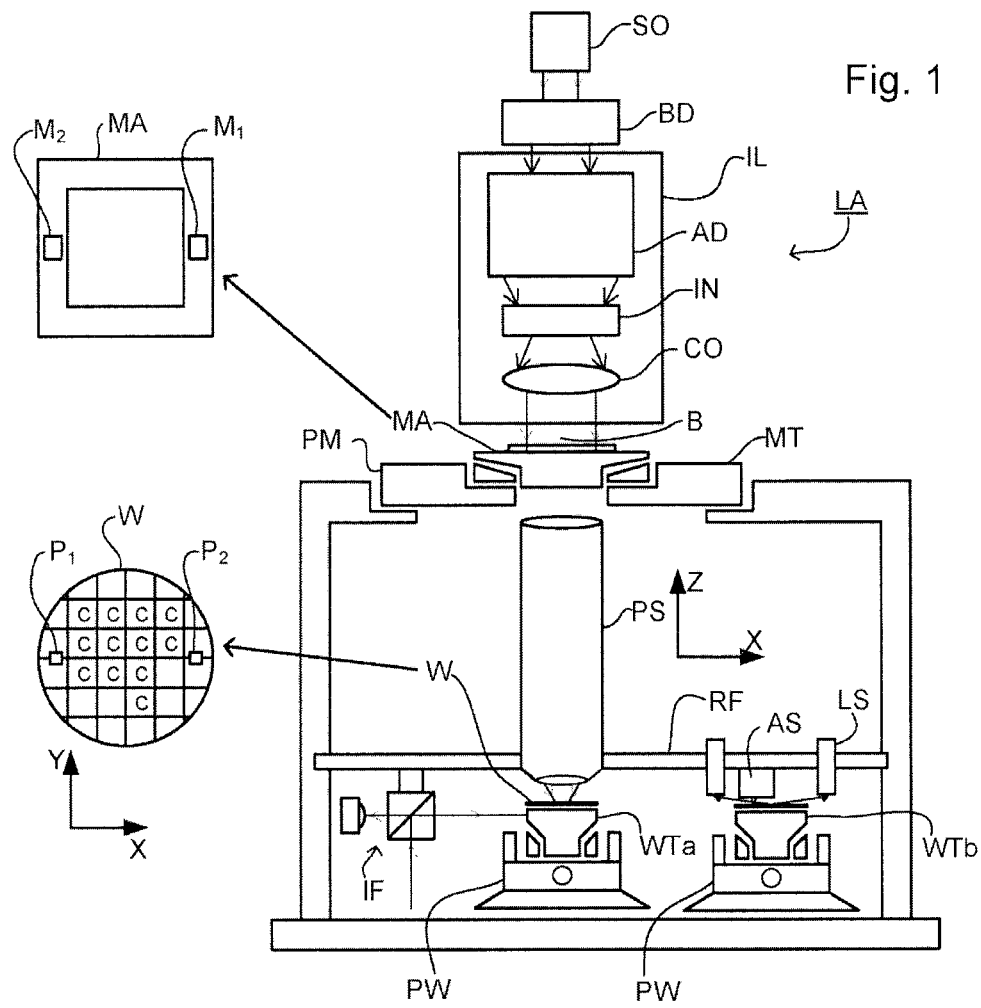
FIG. 1 depicts an embodiment of a lithographic apparatus.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
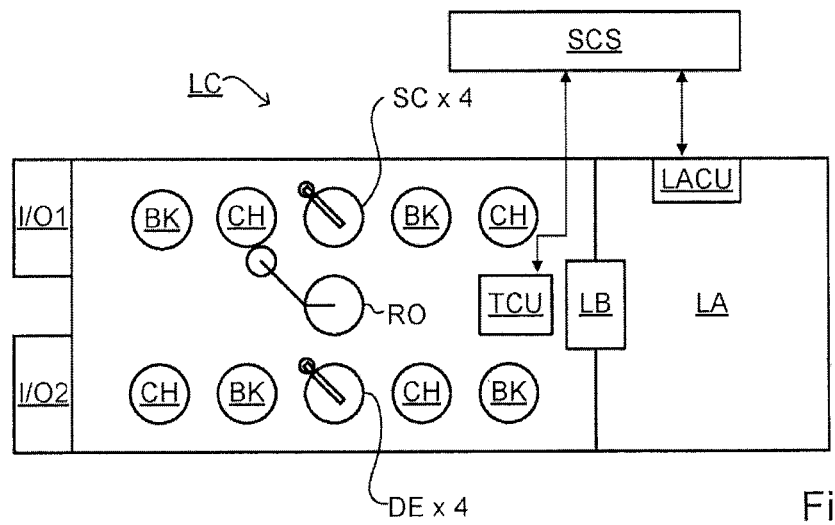
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

An inspection apparatus suitable for use in embodiments is shown in FIG. 3A. A target T and diffracted rays of measurement radiation used to illuminate the target are illustrated in more detail in FIG. 3B. The inspection apparatus illustrated is of a type known as a dark field metrology apparatus. The inspection apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it, e.g., provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis radiation from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

As shown in FIG. 3B, target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIGS. 3A and 3B are shown somewhat off axis, purely to enable them to be more easily distinguished in the diagram.

At least the 0 and $+1^{st}$ orders diffracted by the target T on substrate W are collected by objective lens 16 and directed back through optical element 15. Returning to FIG. 3A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the inspection apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the $-1^{st}$ and $+1^{st}$ orders is present.

The particular forms of aperture plate 13 and field stop 21 shown in FIGS. 3A, 3C and 3D are purely examples. In an embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3A, 3B, 3C or 3D) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the set-up). For measurement of an orthogonal periodic structure, rotation of the target through 90° and 270° might be implemented. Different aperture plates are shown in FIGS. 3C and 3D. The use of these, and numerous other variations and applications of the apparatus are described in the patent application publications mentioned above.

FIG. 4 depicts a (composite) target formed on a substrate according to known practice. The target in this example comprises four periodic structures (e.g., gratings) 32 to 35 positioned closely together so that they will all be within a measurement spot 31 formed by the metrology radiation illumination beam of the inspection apparatus. The four periodic structures thus are all simultaneously illuminated and simultaneously imaged on sensors 19 and 23. In an example dedicated to measurement of overlay, periodic structures 32 to 35 are themselves composite periodic structures formed by overlying periodic structures that are patterned in different layers of, e.g., the semiconductor device formed on substrate W. Periodic structures 32 to 35 may have differently biased overlay offsets in order to facilitate measurement of overlay between the layers in which the different parts of the composite periodic structures are formed. The meaning of overlay bias will be explained below with reference to FIG. 7. Periodic structures 32 to 35 may also differ in their orientation, as shown, so as to diffract incoming radiation in X and Y directions. In one example, periodic structures 32 and 34 are X-direction periodic structures with bias offsets of +d, −d, respectively. Periodic structures 33 and 35 are Y-direction periodic structures with bias offsets +d, −d respectively. Separate images of these periodic structures can be identified in the image captured by sensor 23. This is only one example of a target. A target may comprise more or fewer than 4 periodic structures, or only a single periodic structure.

FIG. 5 shows an example of an image that may be formed on and detected by the sensor 23, using the target of FIG. 4 in the apparatus of FIG. 3, using the aperture plates 13NW or 13SE from FIG. 3D. While the pupil plane image sensor 19 cannot resolve the different individual periodic structures 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target periodic structures 32 to 35. If the targets are located in product areas, product features may also be visible in the periphery of this image field. Image processor and control system PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the patterning process. Overlay performance is an important example of such a parameter.

Figure 6:
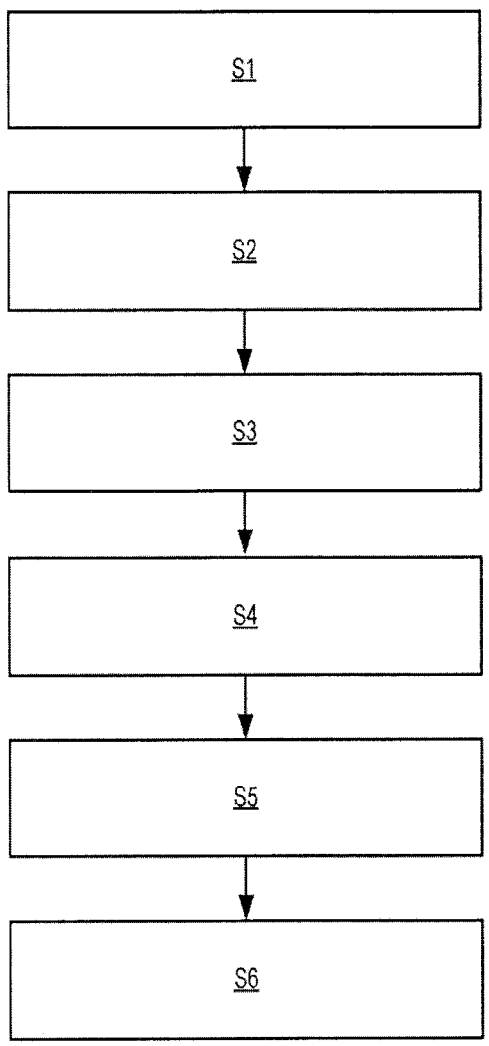
FIG. 6 is a flowchart showing steps of an overlay measurement method using the inspection apparatus of FIG. 3.

FIG. 6 illustrates how, using for example the method described in PCT patent application publication no. WO 2011/012624, overlay error (i.e., undesired and unintentional overlay misalignment) between the two layers containing the component periodic structures 32 to 35 is measured. This measurement is done through identifying target asymmetry, as revealed by comparing the intensities in the $+1^{st}$ order and $-1^{st}$ order dark field images of the target periodic structures (the intensities of other corresponding higher orders can be compared, e.g. $+2^{nd}$ and $-2^{nd}$ orders) to obtain a measure of the intensity asymmetry. At step S1, the substrate, for example a semiconductor wafer, is processed through a lithographic apparatus, such as the lithographic cell of FIG. 2, one or more times, to create a target including the periodic structures 32-35. At S2, using the inspection apparatus of FIG. 3, an image of the periodic structures 32 to 35 is obtained using only one of the first order diffracted beams (say −1). At step S3, whether by changing the illumination mode, or changing the imaging mode, or by rotating substrate W by 180° in the field of view of the inspection apparatus, a second image of the periodic structures using the other first order diffracted beam (+1) can be obtained. Consequently the +1 diffracted radiation is captured in the second image.

Note that, by including only half of the first order diffracted radiation in each image, the 'images' referred to here are not conventional dark field microscopy images. The individual target features of the target periodic structures will not be resolved. Each target periodic structure will be represented simply by an area of a certain intensity level. In step S4, a region of interest (ROI) is identified within the image of each component target periodic structure, from which intensity levels will be measured.

Having identified the ROI for each individual target periodic structure and measured its intensity, the asymmetry of the target, and hence overlay error, can then be determined. This is done (e.g., by the processor PU) in step S5 comparing the intensity values obtained for $+1^{st}$ and $-1^{st}$ orders for each target periodic structure 32-35 to identify their intensity asymmetry, e.g., any difference in their intensity. The term "difference" is not intended to refer only to subtraction. Differences may be calculated in ratio form. In step S6 the measured intensity asymmetries for a number of target periodic structures are used, together with knowledge of any known imposed overlay biases of those target periodic structures, to calculate one or more performance parameters of the patterning process in the vicinity of the target T.

A performance parameter of great interest is overlay. As will be described later, other parameters of performance of the patterning process can be calculated. The performance parameter (e.g., overlay, CD, focus, dose, etc.) can be fed back (or fed forward) for improvement of the patterning process, improvement of the target, and/or used to improve the measurement and calculation process of FIG. 6 itself.

In the patent application publications mentioned above, various techniques are disclosed for improving the quality of overlay measurements using the basic method mentioned above. These techniques will not be explained here in further detail. They may be used in combination with the techniques newly disclosed in the present application.

Further, a metrology target measurement recipe can be used that specifies one or more parameters of the measurement using the measurement system. In an embodiment, the term "metrology target measurement recipe" includes one or more parameters of the measurement itself, one or more parameters of a pattern measured, or both.

In this context, a pattern measured (also referred to as a "target" or "target structure") may be a pattern that is optically measured, e.g., whose diffraction is measured. The pattern measured may be a pattern specially designed or selected for measurement purposes. Multiple copies of a target may be placed on many places on a substrate. For example, a metrology target measurement recipe may be used to measure overlay. In an embodiment, a metrology target measurement recipe may be used to measure another process parameter (e.g., dose, focus, CD, etc.) In an embodiment, a metrology target measurement recipe may be used for measuring alignment of a layer of a pattern being imaged against an existing pattern on a substrate; for example, a metrology target measurement recipe may be used to align the patterning device to the substrate, by measuring a relative position of the substrate.

In an embodiment, if the metrology target measurement recipe comprises one or more parameters of the measurement itself, the one or more parameters of the measurement itself can include one or more parameters relating to a measurement beam and/or measurement apparatus used to make the measurement. For example, if the measurement used in a metrology target measurement recipe is a diffraction-based optical measurement, one or more parameters of the measurement itself may include a wavelength of measurement radiation, and/or a polarization of measurement radiation, and/or measurement radiation intensity distribution, and/or an illumination angle (e.g., incident angle, azimuth angle, etc.) relative to the substrate of measurement radiation, and/or the relative orientation relative to a pattern on the substrate of diffracted measurement radiation, and/or number of measured points or instances of the target, and/or the locations of instances of the target measured on the substrate. The one or more parameters of the measurement itself may include one or more parameters of the metrology apparatus used in the measurement, which can include detector sensitivity, numerical aperture, etc.

In an embodiment, if the metrology target measurement recipe comprises one or more parameters of a pattern measured, the one or more parameters of the pattern measured may include one or more geometric characteristics (such as a shape of at least part of the pattern, and/or orientation of at least part of the pattern, and/or a pitch of at least part of the pattern (e.g., pitch of a periodic structure including the pitch of an upper periodic structure in a layer above that of a lower periodic structure and/or the pitch of the lower periodic structure), and/or a size (e.g., CD) of at least part of the pattern (e.g., the CD of a feature of a periodic structure, including that of a feature of the upper periodic structure and/or the lower periodic structure), and/or a segmentation of a feature of the pattern (e.g., a division of a feature of a periodic structure into sub-structures), and/or a length of a periodic structure or of a feature of the periodic structure), and/or a materials property (e.g., refractive index, extinction coefficient, material type, etc.) of at least part of the pattern, and/or an identification of the pattern (e.g., distinguishing a pattern being from another pattern), etc.

A metrology target measurement recipe may be expressed in a form like $(r_1, r_2, r_3, \ldots r_n; t_1, t_2, t_3, \ldots t_m)$, where $r_i$ are one or more parameters of the measurement and $t_j$ are one or more parameters of one or more patterns measured. As will be appreciated, n and m can be 1. Further, the metrology target measurement recipe does not need to have both one or more parameters of the measurement and one or more parameters of one or more patterns measured; it can have just one or more parameters of the measurement or have just one or more parameters of one or more patterns measured.

A target may be subjected to measurement using two metrology target measurement recipes A and B, e.g., differ on the stage at which a target is measured (e.g., A measures a target when it comprises a latent image structure and B measures a target when it doesn't comprise a latent image structure) and/or differ on the parameters of their measurement. Metrology target measurement recipes A and B can at least differ on the target measured (e.g., A measures a first target and B measures a second different target). Metrology target measurement recipes A and B may differ on the parameters of their measurement of a target. Metrology target measurement recipes A and B may not even be based on the same measurement technique. For example recipe A may be based on diffraction-based measurement and recipe B may be based on scanning electron microscope (SEM) or atomic force microscopy (AFM) measurement.

Accordingly, in an embodiment, to determine one or more metrology target measurement recipes that would yield an accurate measurement of the desired process parameter (e.g., overlay) and/or that yields measurement values of the desired process parameter that is robust to process variability, a plurality of metrology target measurement recipes can be evaluated against one or more performance indicators to identify such one or more accurate and/or robust metrology target measurement recipes.

Now, FIG. 7 shows schematic cross sections of target periodic structures (overlay periodic structures), with different bias offsets. These can be used as the target T on substrate W, as seen in FIGS. 3 and 4. Periodic structures with periodicity in the X direction are shown for the sake of example only. Different combinations of these periodic structures with different biases and with different orientations can be provided separately or as part of a target.

Starting with FIG. 7A, a target 600 formed in at least two layers, labeled L1 and L2, is shown. In the lower or bottom layer L1, a first periodic structure (the lower or bottom periodic structure), for example a grating, is formed by features 602 and spaces 604 on a substrate 606. In layer L2, a second periodic structure, for example a grating, is formed by features 608 and spaces 610. (The cross-section is drawn such that the features 602, 608 (e.g., lines) extend into the page.) The periodic structure pattern repeats with a pitch P in both layers. Features 602 and 608 may take the form of lines, dots, blocks and via holes. In the situation shown at FIG. 7A, there is no overlay contribution due to misalignment, e.g., no overlay error and no imposed bias, so that each feature 608 of the second structure lies exactly over a feature 602 in the first structure.

At FIG. 7B, the same target with a first known imposed bias +d is shown, such that the features 608 of the first structure are shifted by a distance d to the right, relative to the features of the second structure. The bias distance d might be a few nanometers in practice, for example 10 nm-20 nm, while the pitch P is for example in the range 300-1000 nm, for example 500 nm or 600 nm. At FIG. 7C, another feature with a second known imposed bias −d, such that the features of 608 are shifted to the left, is depicted. The value of d need not be the same for each structure. Biased periodic structures of this type shown at FIGS. 7A to 7C are described in the prior patent application publications mentioned above.

FIG. 7D shows schematically a phenomenon of structural asymmetry, in this case structural asymmetry in the first structure (bottom structure asymmetry). The features in the periodic structures at FIGS. 7A to 7C, are shown as perfectly square-sided, when a real feature would have some slope on the side, and a certain roughness. Nevertheless they are intended to be at least symmetrical in profile. The features 602 and/or spaces 604 at FIG. 7D in the first structure no longer have a symmetrical form at all, but rather have become distorted by one or more processing steps. Thus, for example, a bottom surface of each space has become tilted (bottom wall tilt). For example, side wall angles of the features and spaces have become asymmetrical. As a result of this, the overall target asymmetry of a target will comprise an overlay contribution independent of structural asymmetry (i.e., an overlay contribution due to misalignment of the first structure and second structure; itself comprised of overlay error and any known imposed bias) and a structural contribution due to this structural asymmetry in the target.

When overlay is measured by the method of FIG. 6 using only two biased periodic structures, the process-induced structural asymmetry cannot be distinguished from the overlay contribution due to misalignment, and overlay measurements (in particular to measure the undesired overlay error) become unreliable as a result. Structural asymmetry in the first structure (bottom periodic structure) of a target is a common form of structural asymmetry. It may originate, for example, in the substrate processing steps such as chemical-mechanical polishing (CMP), performed after the first structure was originally formed.

In PCT patent application publication no. WO 2013-143814, which is incorporated herein in its entirety by reference, three or more component periodic structures are used to measure overlay by a modified version of the method of FIG. 6. Three or more periodic structures of the type shown in FIGS. 7A to 7C are used to obtain overlay measurements that are to some extent corrected for structural asymmetry in the target periodic structures, such as is caused by bottom structure asymmetry in a practical patterning process.

Figure 8:
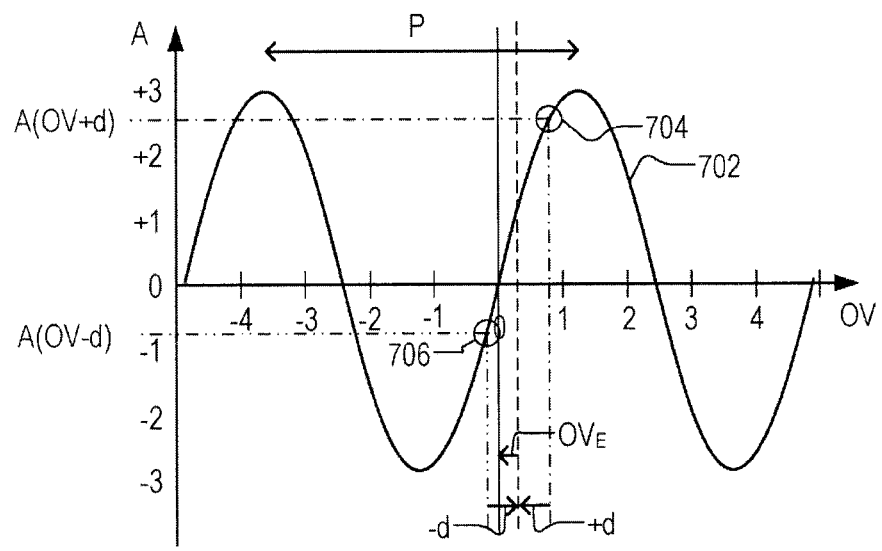
FIG. 8 illustrates principles of overlay measurement in an ideal target, not subject to structural asymmetry.
Figure 9:
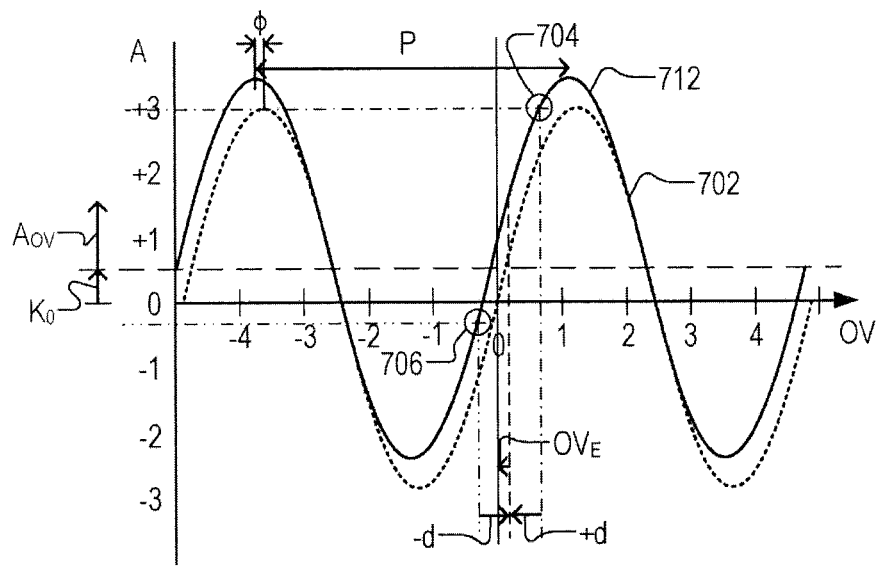
FIG. 9 illustrates principles of overlay measurement in a non-ideal target, with correction of structural asymmetry as disclosed in embodiments herein.

In FIG. 8 a curve 702 illustrates the relationship between overlay OV and intensity asymmetry A for an 'ideal' target having zero offset and no structural asymmetry within the individual periodic structures forming the target, and in particular within the individual periodic structure of the first structure. Consequently, the target asymmetry of this ideal target comprises only an overlay contribution due to misalignment of the first structure and second structure resultant from a known imposed bias and overlay error $OV_E$. This graph, and the graph of FIG. 9, illustrate the principles behind the disclosure only, and in each graph, the units of intensity asymmetry A and overlay OV are arbitrary.

In the 'ideal' situation of FIG. 8, the curve 702 indicates that the intensity asymmetry A has a non-linear periodic relationship (e.g., sinusoidal relationship) with the overlay. The period P of the sinusoidal variation corresponds to the period or pitch P of the periodic structures, converted of course to an appropriate scale. The sinusoidal form is pure in this example, but can include harmonics in real circumstances.

As mentioned above, biased periodic structures (having a known imposed overlay bias) can be used to measure overlay, rather than relying on a single measurement. This bias has a known value defined in the patterning device (e.g. a reticle) from which it was made, that serves as an on-substrate calibration of the overlay corresponding to the measured intensity asymmetry. In the drawing, the calculation is illustrated graphically. In steps S1-S5, intensity asymmetry measurements $A_{+d}$ and $A_{-d}$ are obtained for periodic structures having imposed biases +d and −d respectively (as shown in FIG. 7B and FIG. 7C, for example). Fitting these measurements to the sinusoidal curve gives points 704 and 706 as shown. Knowing the biases, the true overlay error $OV_E$ can be calculated. The pitch P of the sinusoidal curve is known from the design of the target. The vertical scale of the curve 702 is not known to start with, but is an unknown factor which can be referred to as a 1st harmonic proportionality constant, $K_1$. This constant $K_1$ is a measure of the sensitivity of the intensity asymmetry measurements to the target.

In equation terms, the relationship between overlay error $OV_E$ and intensity asymmetry A is assumed to be:

$$A_{\pm d} = K_1 \sin(OV_E \pm d) \tag{1}$$

where overlay error $OV_E$ is expressed on a scale such that the target pitch P corresponds to an angle $2\pi$ radians. Using two measurements of gratings with different, known biases (e.g. +d and −d), the overlay error $OV_E$ can be calculated using:

$$OV_E = a\tan\left(\frac{A_{+d} + A_{-d}}{A_{+d} - A_{-d}} \cdot \tan(d)\right) \tag{2}$$

FIG. 9 shows a first effect of introducing structural asymmetry, for example the bottom periodic structure asymmetry illustrated in FIG. 7D. The 'ideal' sinusoidal curve 702 no longer applies. However, at least approximately, bottom periodic structure asymmetry or other structural asymmetry has the effect of adding an intensity shift term $K_0$ and a phase shift term $\phi$ to the intensity asymmetry $A_{\pm d}$. The resulting curve is shown as 712 in the diagram, with label $K_0$ indicating the intensity shift term, and label $\phi$ indicating the phase offset term. The intensity shift term $K_0$ and phase shift term $\phi$ are dependent upon a combination of the target and a selected characteristic of the measurement radiation, such as the wavelength and/or polarization of the measurement radiation, and is sensitive to process variations. In equation terms, the relationship used for calculation in step S6 becomes:

$$A_{\pm d} = K_0 + K_1 \sin(OV_E \pm d + \phi) \quad (3)$$

Where there is structural asymmetry, the overlay model described by equation (2) will provide overlay error values which are impacted by the intensity shift term $K_0$ and phase shift term $\phi$, and will be inaccurate as a consequence. The structural asymmetry will also result in differences in measurements of the same target using one or more different measurement parameters (e.g., measurement beam wavelength and/or polarization), when mapping the overlay error, because intensity and phase shift are wavelength and/or polarization dependent.

The overlay calculations of modified step S6 rely on certain assumptions. Firstly, it is assumed intensity asymmetry behaves as a sine function of the overlay, with the period P corresponding to the grating pitch. These assumptions are valid for present overlay ranges. The number of harmonics can be designed to be small, because the small pitch-wavelength ratio only allows for a small number of propagating diffraction orders from the grating. However, in practice the overlay contribution to the intensity asymmetry due to misalignment may not necessarily be truly sinusoidal, and may not necessarily be completely symmetrical about OV=0.

In an embodiment, the target asymmetry of a target is determined, and therefore overlay which does not neglect the effect of the structural asymmetry, while allowing the use of current target designs such as those illustrated in FIG. 4, can be determined. This may be performed as a modification to step S6 in the method illustrated in FIG. 6. In an embodiment, the method can calculate overlay errors accurately using real substrate measurement data, and which can determine an optimal or desired metrology target measurement recipe for measuring a target. No simulation or reconstruction may be needed.

In particular, it has been observed that, for the overlay range of interest, both the intensity term and phase term of the overlay contribution due to structural asymmetry is independent of the overlay contribution due to misalignment.

So, the total overlay OV (i.e., the measured overlay) can be represented in terms of the overlay contribution due to structural asymmetry $OV_{SA}$ and an overlay contribution independent of structural asymmetry $OV_{NSA}$:

$$OV = OV_{NSA} + OV_{SA} \quad (4)$$

The overlay contribution independent of structural asymmetry $OV_{NSA}$ may comprise the overlay error $OV_E$ (any unintentional misalignment of the layers) and/or any known imposed bias d. Separating the overlay contribution due to structural asymmetry $OV_{SA}$ into constituent intensity term $OV_{SAI}$ and phase term $OV_{SA\phi}$ yields:

$$OV = OV_{NSA} + (OV_{SAI} + OV_{SA\phi}) \quad (5)$$

Further, it has been determined that the constituent intensity term $OV_{SAI}$ of the overlay contribution due to structural asymmetry is proportional to the structural asymmetry in the lower grating BGA (where $\gamma$ is a proportionality constant):

$$OV_{SAI} = \gamma * BGA \quad (6)$$

Assuming that there is a relationship G (which can be referred to as the process robustness index) between intensity term $OV_{SAI}$ and phase term $OV_{SA\phi}$:

$$OV_{SA\phi} = G * OV_{SAI} \quad (7)$$

equation (5) can therefore be rewritten as:

$$\begin{aligned} OV &= OV_{NSA} + \gamma * BGA + G * OV_{SAI} \\ &= OV_{NSA} + \gamma * BGA + G * \gamma * BGA \\ &= OV_{NSA} + \xi_{BGA} * BGA \end{aligned} \quad (8)$$

where $\xi_{BGA} = \gamma + G*\gamma$. Provided that the relationship function $\xi_{BGA}$ is constant across the substrate then, by determining relationship function $\xi_{BGA}$, it is possible to determine the overlay which is independent of structural asymmetry $OV_{NSA}$. This overlay measurement therefore does not include the overlay contribution due to structural asymmetry $OV_{SA}$, which combines the intensity term and phase term. A constant relationship function $\xi$ also indicates that the process robustness index G is also constant across the substrate, even with stack variation. So a constant relationship function $\xi$ indicates that the metrology target measurement recipe is robust to process variation.

The relationship function $\xi_{BGA}$ can be found by measuring the targets on a substrate using two different sets of measurement parameters. In this case:

$$OV_A = OV_{NSA,A} + \xi_{BGA,A} * BGA_A$$

$$OV_B = OV_{NSA,B} + \xi_{BGA,B} * BGA_B$$

$$\Delta OV = \xi_{BGA,A} * BGA_A - \xi_{BGA,B} * BGA_B + C \quad (9)$$

where the subscripts A and B denote terms attributable to measurements made using a set A of measurement parameters and a set B of measurement parameters respectively; with $OV_A$ and $OV_B$ being the measured overlay with measurement parameter set A and measurement parameter set B respectively. $\Delta OV$ is the difference between the measured overlay $OV_A$ using measurement parameter set A and the measured overlay $OV_B$ using measurement parameter set B. Equation (9) is further based upon the assumption that $OV_{NSA,A} = OV_{NSA,B} = OV_{NSA}$. In other words, the overlay which is independent of structural asymmetry is assumed to be independent of the measurement parameters. It is only the structural asymmetry signal BGA which is dependent on measurement parameters.

Measurement parameter sets A and B can differ in wavelength and/or polarization of the measurement radiation.

In one embodiment, the relationship function $\xi_{BGA}$ can be found by determining the relationship between the measured structural asymmetry in lower grating $BGA_A$ using measurement parameter set A, the measured structural asymmetry in lower grating $BGA_B$ using measurement parameter set B and the difference in overlay measurements $\Delta OV$ between measurement parameter sets A and B. Using $\xi_{BGA}$ the overlay $OV_{NSAA}=OV_{NSAB}=OV_{NSA}$ can be determined from equation (9).

In addition to or alternatively to structural asymmetry in a target, a stack difference between adjacent periodic structures of a target or between adjacent targets may be a factor that adversely affects the accuracy of measurement, such as overlay measurement. Stack difference may be understood as an un-designed difference in physical configurations between adjacent periodic structures or targets. Stack difference causes a difference in an optical property (e.g., intensity, polarization, etc.) of measurement radiation between the adjacent periodic structures or targets that is due to other than overlay error, other than intentional bias and other than structural asymmetry common to the adjacent periodic structures or targets. Stack difference includes, but is not limited to, a thickness difference between the adjacent periodic structures or targets (e.g., a difference in thickness of one or more layers such that one periodic structure or target is higher or lower than another periodic structure or target designed to be at a substantially equal level), a refractive index difference between the adjacent periodic structures or targets (e.g., a difference in refractive index of one or more layers such that the combined refractive index for the one or more layers for one periodic structure or target is different than the combined refractive index for the one or more layers for of another periodic structure or target even though designed to have a substantially equal combined refractive index), a difference in material between the adjacent periodic structures or targets (e.g., a difference in the material type, material uniformity, etc. of one or more layers such that there is a difference in material for one periodic structure or target from another periodic structure or target designed to have a substantially same material), a difference in the grating period of the structures of adjacent periodic structures or targets (e.g., a difference in the grating period for one periodic structure or target from another periodic structure or target designed to have a substantially same grating period), a difference in depth of the structures of adjacent periodic structures or targets (e.g., a difference due to etching in the depth of structures of one periodic structure or target from another periodic structure or target designed to have a substantially same depth), a difference in width (CD) of the features of adjacent periodic structures or targets (e.g., a difference in the width of features of one periodic structure or target from another periodic structure or target designed to have a substantially same width of features), etc. In some examples, the stack difference is introduced by processing steps, such as CMP, layer deposition, etching, etc. in the patterning process. In an embodiment, periodic structures or targets are adjacent if within 200 μm of each other, within 150 μm of each other, within 100 μm of each other, within 75 μm of each other, within 50 μm of each other, within 40 μm of each other, within 30 μm of each other, within 20 μm of each other, or within 10 μm of each other.

FIG. 10 schematically illustrates a situation where no stack difference exists between adjacent periodic structures (e.g., composite grating) of a target. For the sake of simplicity, the structure asymmetry is not considered in this example. Further, in the example of FIGS. 10 and 11, overlay is considered as the measurement parameter. Appropriate adjustments would be made for different parameter measurements using a target, such as CD, focus, dose, etc.

Figure 10A:
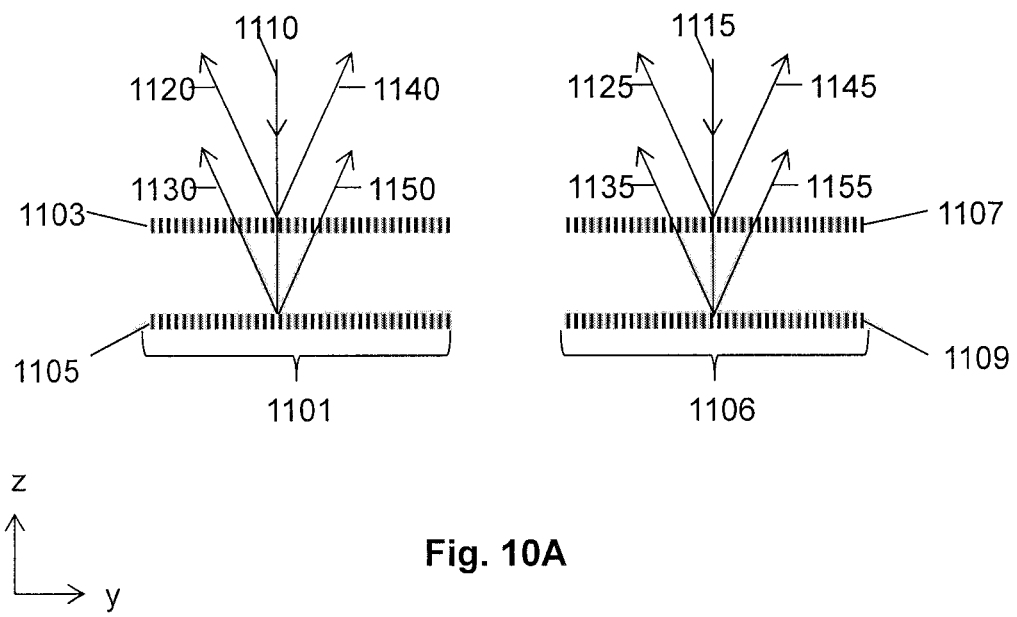
FIG. 10A schematically illustrates a situation where no stack difference exists between a first target periodic structure with a bias +d and a second target periodic structure with a bias −d, and illustrates diffraction signals following diffraction by the first and second target periodic structures.

FIG. 10A shows a first periodic structure 1101 of a target in the form of a composite grating with a bias +d and an adjacent second periodic structure 1106 of the target in the form of a composite grating with a bias −d. A first incident measurement radiation beam 1110 is illuminated on the first structure 1105 and the second structure 1103 of the first periodic structure 1101, where there is a bias +d between the first structure 1105 and the second structure 1103. As a result, $-1^{st}$ diffraction order signals 1130 and 1120 are diffracted by the first structure 1105 and the second structure 1103, respectively. The $-1^{st}$ diffraction order signal diffracted by the first periodic structure 1101, $I'_{-1}{}^{+d}$, may be understood as the combination of the $-1^{st}$ diffraction order signals 1130 and 1120. Additionally, $+1^{st}$ diffraction order signals 1150 and 1140 are diffracted by the first structure 1105 and the second structure 1103, respectively. The $+1^{st}$ diffraction order signal diffracted by the first periodic structure 1101, $I'_{+1}{}^{+d}$, may be understood as the combination of the $+1^{st}$ diffraction order signals 1150 and 1140. Accordingly, the $-1^{st}$ diffraction order signal diffracted by the first periodic structure 1101, $I'_{-1}{}^{+d}$, and the $+1^{st}$ diffraction order signal diffracted by the first periodic structure 1101, $I'_{+1}{}^{+d}$, may be collectively expressed by:

$$I'_{\pm 1}{}^{+d} = 1 + C^* \cos(\beta \pm \alpha_+) \quad (10)$$

where C indicates the contrast of the signal (which is a function of the periodic structure design, measurement wavelength, etc.), $$\beta = 4\pi \frac{T}{\lambda},$$

T is the thickness of the first periodic structure, λ is the measurement radiation wavelength, phase term $$\alpha_+ = 2\pi \frac{OV + d}{P},$$

Figures 10B, 10C:
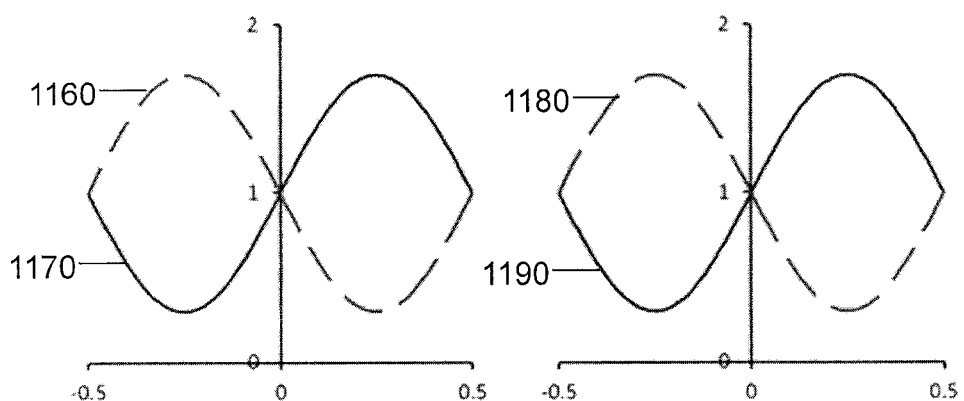
FIG. 10B schematically illustrates the intensity variations of the combined $+1^{st}$ diffraction order signal and the combined $-1^{st}$ diffraction order signal diffracted by the first target periodic structure.
FIG. 10C schematically illustrates the intensity variations of the combined $+1^{st}$ diffraction order signal and the combined $-1^{st}$ diffraction order signal diffracted by the second target periodic structure.

OV is the actual overlay (due to any unintentional misalignment of the layers), and P is the pitch of the first structure 1105 and the second structure 1103 of the first periodic structure 1101. In FIG. 10B, the intensity profiles of the $-1^{st}$ diffraction order signal diffracted by the first periodic structure 1101, $I'_{-1}{}^{+d}$, and the $+1^{st}$ diffraction order signal diffracted by the first periodic structure 1101, $I'_{+1}{}^{+d}$ are depicted in traces 1160 and 1170, respectively according to equation (10).

Similarly, a second incident measurement radiation beam 1115 is illuminated on the first structure 1109 and the second structure 1107 of the second periodic structure 1106, where there is a bias −d between the first structure 1109 and the second structure 1106. As a result, $-1^{st}$ diffraction order signals 1135 and 1125 are diffracted by the first structure 1109 and the second structure 1107 of the second periodic structure 1106, respectively. The $-1^{st}$ diffraction order signal diffracted by the second periodic structure 1106, $I'_{-1}{}^{-d}$, may be understood as the combination of the $-1^{st}$ diffraction order signals 1135 and 1125. Additionally, $+1^{st}$ diffraction order signals 1155 and 1145 are diffracted by the first structure 1109 and the second structure 1107, respectively. The $+1^{st}$ diffraction order signal diffracted by the second periodic structure 1106, $I'_{+1}{}^{-d}$, may be understood as the combination of the $+1^{st}$ diffraction order signals 1155 and 1145. Accordingly, the $-1^{st}$ diffraction order signal diffracted by the second periodic structure 1106, and $I'_{-1}{}^{-d}$, the $+1^{st}$ diffraction order signal diffracted by the second periodic structure 1106, $I'_{+1}{}^{-d}$, may be collectively expressed by:

$$I'_{\pm 1}{}^{-d} = 1 + C^* \cos(\beta \pm \alpha) \quad (11)$$

where C indicates the contrast of the respective signal, $$\beta = 4\pi \frac{T}{\lambda},$$

T is the thickness of the second periodic structure, λ is the measurement radiation wavelength, phase term $$\alpha_- = 2\pi \frac{OV - d}{P},$$

OV is the actual overlay (due to any unintentional misalignment of the layers), and P is the pitch of the first structure 1109 and the second structure 1107 of the second periodic structure 1106. In FIG. 10C, the intensity profiles of the $-1^{st}$ diffraction order signal diffracted by the second periodic structure 1106, $I'_{-1}{}^{-d}$, and the $+1^{st}$ diffraction order signal diffracted by the second periodic structure 1106, $I'_{+1}{}^{-d}$, are depicted in traces 1180 and 1190, respectively according to equation (11).

Now, FIG. 11 illustrates a situation where a stack difference exists between a first periodic structure 1201 with a bias +d and an adjacent second periodic structure 1206 with a bias −d. In this case, the stack difference is a different in thickness as shown in FIG. 11A and described hereafter. Similar to FIG. 10, a first incident measurement radiation beam 1210 is illuminated on the first structure 1205 of the first periodic structure 1201 and the second structure 1203 of the first periodic structure 1201, respectively. As a result, $-1^{st}$ diffraction order signals 1230 and 1220 are diffracted by the first structure 1205 and the second structure 1203, respectively. Accordingly, the $-1^{st}$ diffraction order signal diffracted by the first periodic structure 1201, $I_{-1}{}^{-d}$, may be understood as the combination of the $-1^{st}$ diffraction order signals 1230 and 1220. Additionally, $+1^{st}$ diffraction order signals 1250 and 1240 are diffracted by the first structure 1205 and the second structure 1203, respectively. Accordingly, the $+1^{st}$ diffraction order signal diffracted by the first periodic structure 1201, $I_{+1}{}^{-d}$, may be understood as the combination of the $+1^{st}$ diffraction order signals 1250 and 1240.

Similarly, a second incident measurement radiation beam 1215 is illuminated on the first structure 1209 and the second structure 1207 of the second periodic structure 1206, respectively. As a result, $-1^{st}$ diffraction order signals 1235 and 1225 are diffracted by the first structure 1209 and the second structure 1207, respectively. Accordingly, the $-1^{st}$ diffraction order signal diffracted by the second periodic structure 1206, $I_{-1}{}^{+d}$, may be understood as the combination of the $-1^{st}$ diffraction order signals 1225 and 1235. Additionally, $+1^{st}$ diffraction order signals 1255 and 1245 are diffracted by the first structure 1209 and the second structure 1207, respectively. Accordingly, the $+1^{st}$ diffraction order signal diffracted by the second periodic structure 1206, $I_{+1}{}^{+d}$, may be understood as the combination of the $+1^{st}$ diffraction order signals 1255 and 1245.

As an example of stack difference, the first periodic structure 1201 and the second periodic structure 1206 may have a difference in thickness as shown in FIG. 11A. However, in another example, the stack difference may be created by one or more other factors that allow for an additional or alternative difference in un-designed physical configuration between the first periodic structure 1201 and the second periodic structure 1206. For example, a stack difference may be created when the first periodic structure 1201 is more opaque to the first measurement radiation beam 1210 than the second periodic structure 1206. For example, there may be a difference in material (e.g., a same type of material having a different refractive index, a different type of material, etc.) between the first periodic structure 1201 and the second periodic structure 1206. As another example, there may be a difference in pitch of first periodic structure 1201 relative to the second periodic structure 1206 even though they are designed to have substantially the same pitch. These examples of stack difference are not the only ways there can be a stack difference and so should not be considered as limiting.

Referring back to equations (10) and (11), the stack difference may introduce three additional terms in each of equations (10) and (11). The first term, $\Delta I_N$, indicates an actual change to the intensity of the respective signal. The second term, $\Delta C_N$, indicates an actual change to the contrast of the respective signal. The third term, $\Delta\beta$, indicates an actual change to the phase of the respective signal. The three terms are dependent on the wavelength and/or the polarization of the measurement radiation beams 1210 and 1215. So, in the presence of a stack difference, the $-1^{st}$ diffraction order signal diffracted by the first periodic structure 1201, $I_{-1}{}^{+d}$, and the $+1^{st}$ diffraction order signal diffracted by the first periodic structure 1201, $I_{+1}{}^{+d}$, may be collectively expressed by:

$$I_{\pm 1}{}^{+d} = (1+\Delta I_N)*\{1+C*(1+\Delta C_N)*\cos[(\beta+\Delta\beta)\pm\alpha_+]\} \quad (12)$$

In FIG. 11B, the intensity profiles of the $-1^{st}$ diffraction order signal diffracted by the first periodic structure 1201, $I_{-1}{}^{+d}$, and the $+1^{st}$ diffraction order signal diffracted by the first periodic structure 1201, $I_{+1}{}^{+d}$, are depicted in traces 1260 and 1262, respectively according to equation (12).

Figures 11D, 11E:
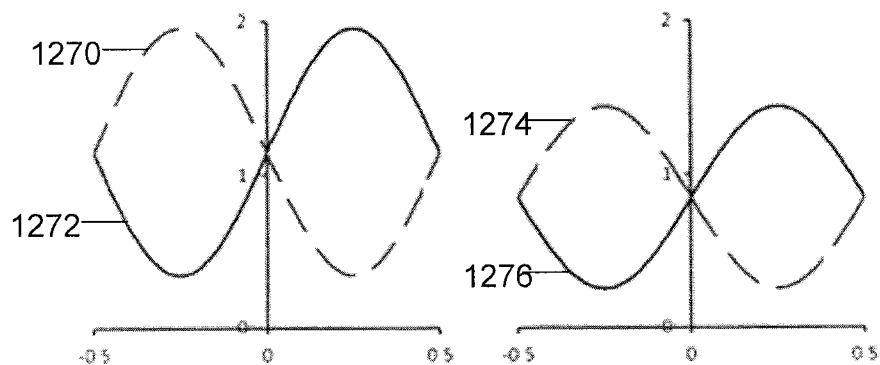
FIG. 11D and FIG. 11E illustrate contrast variations of the combined $+1^{st}$ diffraction order signal and the combined $-1^{st}$ diffraction order signal diffracted by the first target periodic structure and the second target periodic structure, respectively.

In FIG. 11D, the contrast profiles of the $-1^{st}$ diffraction order signal diffracted by the first periodic structure 1201, $I_{-1}{}^{+d}$, and the $+1^{st}$ diffraction order signal diffracted by the first periodic structure 1201, $I_{+1}{}^{+d}$, are depicted in traces 1270 and 1272, respectively according to equation (12).

Figures 11F, 11G:
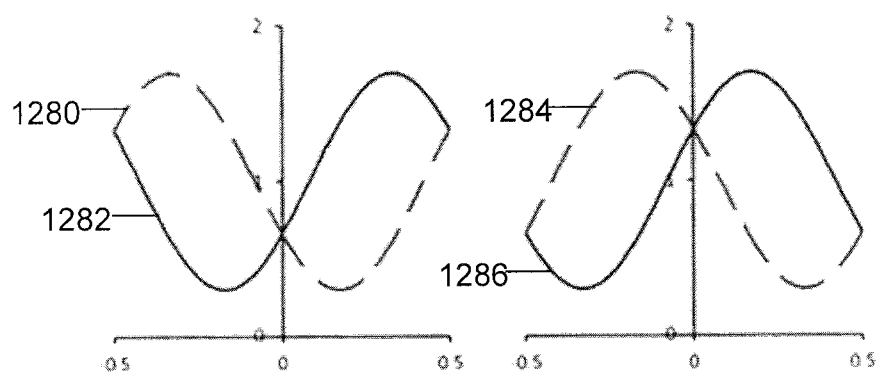
FIG. 11F and FIG. 11G illustrate phase variations of the combined +1$^{st}$ diffraction order signal and the combined −1$^{st}$ diffraction order signal diffracted by the first target periodic structure and the second target periodic structure, respectively.

In FIG. 11F, the phase profiles of the $-1^{st}$ diffraction order signal diffracted by the first periodic structure 1201, $I_{-1}{}^{+d}$, and the $+1^{st}$ diffraction order signal diffracted by the first periodic structure 1201, $I_{+1}{}^{+d}$, are depicted in traces 1280 and 1282, respectively according to equation (12).

Further, in the presence of the stack difference, the $-1^{st}$ diffraction order signal diffracted by the second periodic structure 1206, $I_{-1}{}^{-d}$, and the $+1^{st}$ diffraction order signal diffracted by the second periodic structure 1206, $I_{+1}{}^{-d}$, may be collectively expressed by:

$$I_{\pm 1}{}^{-d} = (1-\Delta I_N)*\{1+C*(1-\Delta C_N)*\cos[(\beta-\Delta\beta)\pm\alpha_-]\} \quad (13)$$

In FIG. 11C, the intensity profiles of the $-1^{st}$ diffraction order signal diffracted by the second periodic structure 1206, $I_{-1}{}^{-d}$, and the $+1^{st}$ diffraction order signal diffracted by the second periodic structure 1206, $I_{+1}{}^{-d}$, are depicted in traces 1264 and 1266, respectively according to equation (13). Thus, compared to FIG. 11B, there is an intensity imbalance, which can lead to measurement error.

In FIG. 11E, the contrast profiles of the $-1^{st}$ diffraction order signal diffracted by the second periodic structure 1206, $I_{-1}{}^{-d}$, and the $+1^{st}$ diffraction order signal diffracted by the second periodic structure 1206, $I_{+1}{}^{-d}$, are depicted in traces 1274 and 1276, respectively according to equation (13). Thus, compared to FIG. 11D, there is a contrast imbalance, which can lead to measurement error.

In FIG. 11G, the phase profiles of the $-1^{st}$ diffraction order signal diffracted by the second periodic structure 1206, $I_{-1}^{-d}$, and the $+1^{st}$ diffraction order signal diffracted by the second periodic structure 1206, $I_{+1}^{-d}$, are depicted in traces 1284 and 1286, respectively according to equation (13). Thus, compared to FIG. 11F, there is a phase imbalance, which can lead to measurement error.

The measured intensity asymmetry of the first periodic structure 1201, $\Delta I^{+d}$ is defined as:

$$\Delta I^{+d} = I_{+1}^{+d} - I_{-1}^{+d} \quad (14)$$

By incorporating equation (12) into equation (14) and assuming $+\Delta I_N$ and $\Delta C_N$ are small, $\Delta I^{+d}$ can be expressed as:

$$\Delta I^{+d} \approx \frac{4\pi}{P} C(1 + \Delta I_N + \Delta C_N)\sin(\beta + \Delta\beta)(OV + d) \quad (15A)$$

And, the mean intensity $\hat{I}^{+d}$ can be expressed as:

$$\hat{I}^{+d} \approx 1 + \Delta I_N + C(1 + \Delta I_N + \Delta C_N)\cos(\beta + \Delta\beta)\left(q - 4\pi^2 \frac{dxOV}{P^2}\right) \quad (15B)$$

$$\text{where } q = 1 - \frac{2\pi^2}{P^2}(OV^2 + d^2)$$

Similarly, the measured intensity asymmetry of the second periodic structure 1206, $\Delta I^{-d}$, is defined as:

$$\Delta I^{-d} = I_{+1}^{-d} - I_{-1}^{-d} \quad (16)$$

By incorporating equation (13) into equation (16) and assuming $+\Delta I_N$ and $\Delta C_N$ are small, $\Delta I^{-d}$ can be expressed as:

$$\Delta I^{-d} \approx \frac{4\pi}{P} C(1 - \Delta I_N - \Delta C_N)\sin(\beta - \Delta\beta)(OV - d) \quad (17A)$$

And, the mean intensity $\hat{I}^{-d}$ can be expressed as:

$$\hat{I}^{-d} \approx 1 - \Delta I_N + C(1 - \Delta I_N - \Delta C_N)\cos(\beta - \Delta\beta)\left(q + 4\pi^2 \frac{dxOV}{P^2}\right) \quad (17B)$$

The measured overlay $OV_m$ can be calculated by:

$$OV_m = d * \frac{\Delta I^{+d} + \Delta I^{-d}}{\Delta I^{+d} - \Delta I^{-d}} \quad (18)$$

By incorporating equations (14)-(17) into equation (18), an error in overlay measurement $\Delta\varepsilon_{OV}$ can be obtained as:

$$\Delta\varepsilon_{OV} = OV_m - OV \approx d*\left[1 - \left(\frac{OV}{d}\right)^2\right]*[\cot(\beta)*\Delta\beta + \Delta I_N + \Delta C_N] \quad (19)$$

When $\beta \approx 90°$ (for a well-designed target) and the overlay (OV) is small (relative to the bias d), equation (19) may be further simplified as:

$$\Delta\varepsilon_{OV} = OV_m - OV \approx d*(\Delta I_N + \Delta C_N) \quad (20)$$

Further, when the first periodic structure 1201 and the second periodic structure 1206 are well designed with a contrast C equal to or approximately equal to 1, $\Delta C_N$ is approximately equal to zero. Therefore, the measurement error $\Delta\varepsilon_{OV}$ can be further simplified as:

$$\Delta\varepsilon_{OV} = OV_m - OV \approx d*\Delta I_N \quad (21)$$

As can be seen from equations (19)-(21), the measured overlay $OV_m$ differs from the actual overlay OV by a measurement error $\Delta\varepsilon_{OV}$ produced by the stack difference. Thus, accuracy in measurement (e.g., measurement of alignment where the target is used for alignment, measurement of overlay where the target is used for overlay measurement, etc.) can be significantly reduced by correcting for stack difference between the adjacent periodic structures or targets. The measurement error that arises from the stack difference may be corrected with changes to the process of creating or measuring the periodic structures or targets (e.g., process offsets) which are, for example, based on yield (i.e., evaluation of processed devices to determine whether the periodic structures or targets were accurate), evaluation of cross-sections of adjacent periodic structures or targets, or complex measurement and analytical reconstructions. These methods can be slow and/or destructive. They may only be effective to correct a constant process error. Further, variation in stack difference of the adjacent periodic structures or targets may not be effectively solved by cross-sections or yield measurements. Accordingly, there is a desire for, for example, a robust solution of evaluating and correcting for stack difference.

In order to characterize the stack difference, one or more stack difference parameters can be defined. A stack difference parameter is a measure of the un-designed difference in physical configuration of the adjacent periodic structures or targets. The stack difference parameters can be used to correct measurements made using the periodic structures or targets. The corrected measurements naturally may be used in creating, qualifying, verifying, etc., for example, devices by a patterning process. Additionally or alternatively, the stack difference parameter (or a parameter derived from the stack difference parameter, such as a corrected measurement) can be used in the (re-)design of one or more of the adjacent periodic structures or targets (e.g., making a change to a layout of the design), may be used in the process of forming one or more of the adjacent periodic structures or targets (e.g., making a change in material, a change in a printing step or condition, etc.), may be used in formulation of the measurement conditions (e.g., make a change in the optical measurement formulation in terms of wavelength, polarization, illumination mode, etc. of the measurement beam), etc. In an embodiment, the stack difference parameter can be determined from evaluating cross-sections of the adjacent periodic structures or targets.

In an embodiment, the stack difference parameter can be determined for lower adjacent gratings of a composite grating by evaluating the lower adjacent gratings before the upper gratings are applied. In an embodiment, the stack difference parameter can be derived from a reconstruction (as described above) of the adjacent periodic structures or targets from optical measurements of the adjacent periodic structures or targets or from cross-sections of the adjacent periodic structures or targets. That is, the physical dimensions, characteristics, materials properties, etc. are reconstructed and the differences between the adjacent periodic structures or targets are determined to arrive at a stack difference parameter.

In an embodiment, the stack difference parameter can be used in association with measured radiation from the adjacent periodic structures or targets to derive, for example, a corrected measurement of a parameter of interest, such as overlay, CD, focus, dose, etc. In an embodiment, the stack difference parameter can be used in a simulation of optical measurement of the adjacent periodic structures or targets to derive, for example, a corrected simulated measurement of a parameter of interest, such as overlay, CD, focus, dose, etc. A Maxwell solver and rigorous coupled-wave analysis (RCWA) can be used to arrive at values of the stack difference parameter and/or a corrected simulated measurement of a parameter of interest.

An embodiment of the stack difference parameter is a periodic structure intensity imbalance (GI) which can be defined as:

$$GI = 2 * \frac{\hat{I}^{+d} - \hat{I}^{-d}}{\hat{I}^{+d} + \hat{I}^{-d}} \quad (22)$$

where $\hat{I}^{+d}$ is the average of the $+1^{st}$ diffraction order intensity signal diffracted by the first periodic structure 1201, $I_{+1}^{+d}$, and $-1^{st}$ diffraction order intensity signal diffracted by the first periodic structure 1201, $I_{-1}^{+d}$. Similarly, $\hat{I}^{-d}$ is the average of the $+1^{st}$ diffraction order intensity signal diffracted by the second periodic structure 1206, $I_{+1}^{-d}$, and $-1^{st}$ diffraction order intensity signal diffracted by the second periodic structure 1206, $I_{-1}^{-d}$. In an embodiment, the periodic structure intensity imbalance (GI) can be a derived version, such as $\hat{I}^{+d} + \hat{I}^{-d}$, $$\frac{\hat{I}^{+d} - \hat{I}^{-d}}{\hat{I}^{+d} + \hat{I}^{-d}}, \frac{\hat{I}^{+d} + \hat{I}^{-d}}{\hat{I}^{+d} - \hat{I}^{-d}},$$

etc.

By incorporating equations (12) and (13) into equation (22), the periodic structure intensity imbalance GI becomes:

$$GI = 2 * \frac{\Delta I_N - C\sin(\beta)[\Delta\beta + \cot(\beta)(\Delta C_N + \Delta I_N)]}{1 + C\cos(\beta)} - \quad (23)$$

$$8\pi^2 \frac{C\cos(\beta)}{1 + C\cos(\beta)} \frac{d * OV}{p^2}$$

In equation (23), the first term is related to the stack difference, and the second term is related to the actual overlay OV. The second term is much smaller than the first term. Particularly, when the metrology target measurement recipe is well designed, $\beta \approx 90°$ and the overlay (OV) is small, the impact of the actual overlay OV on the periodic structure intensity imbalance GI becomes negligible since the second term becomes zero. Therefore, the periodic structure intensity imbalance GI is dominated by the stack difference as:

$$GI \approx 2\Delta I_N - 2C\Delta\beta \quad (24)$$

When compared to equation (21), it can be seen that the periodic structure intensity imbalance GI is a good indicator of stack difference between the first periodic structure 1201 and the second periodic structure 1206 and thus a good stack difference parameter. To account for a non-negligible second term, a threshold can be applied to periodic structure intensity imbalance GI to identify whether there is a significant stack difference or not. That is, for example, if periodic structure intensity imbalance GI exceeds a threshold, then there is a stack difference and periodic structure intensity imbalance GI can be used; otherwise, if periodic structure intensity imbalance GI is below the threshold, the combination of the first and second terms does not identify a significant stack difference.

Thus, the measurement error $\Delta\varepsilon_{OV}$ can be generally represented in terms of a stack difference parameter SD as:

$$\Delta\varepsilon_{OV} = OV_m - OV = \xi_{SD} * SD \quad (25)$$

where $\xi_{SD}$ is a relationship function between the stack difference parameter and the measurement error for the first periodic structure 1201 and the second periodic structure 1206. In an embodiment, the stack difference parameter is or comprises periodic structure intensity imbalance GI (or derived therefrom). Thus, the measurement error $\Delta\varepsilon_{OV}$ may be denoted as $\Delta\varepsilon_{OV} = \xi_{SD} * GI$.

Further, in an embodiment, $\Delta\varepsilon_{OV}$ can be extended by incorporating structural asymmetry such that $$\Delta\varepsilon_{OV} = OV_m - OV = \xi_{SD} * SD + \xi_{BGA} * BGA \quad (26)$$

where BGA is structural asymmetry in the periodic structures 1201, 1206 and $\xi_{BGA}$ is the relationship function between the structural asymmetry and the measurement error for the periodic structures 1201 and 1206.

In equations (25) and (26), $OV_m$ and SD (where, e.g., SD is periodic structure intensity imbalance GI (or derived therefrom)) can be calculated based on measurements of $I_{\pm 1}(\pm d)$, respectively. Further, the values of $OV_m$, SD, and $\xi_{SD}$ are all dependent on one or more measurement parameters (e.g., wavelength, polarization, etc.).

In an embodiment, the relationship function $\xi_{SD}$ can be found by measuring the adjacent periodic structures or targets using two different measurement parameters. The relationship function $\xi_{SD}$ may be merely a constant value. In this case:

$$OV_{m,A} - OV = \xi_{SD,A} * SD_A$$

$$OV_{m,B} - OV = \tau_{SD,B} * SD_B$$

$$\Delta OV = OV_{m,A} - OV_{m,B} = \xi_{SD,A} * SD_A - \xi_{SD,B} * SD_B \quad (27)$$

where the subscripts A and B denote terms attributable to measurements made using measurement parameter set A and measurement parameter set B respectively. Specifically, $OV_{m,A}$ and $OV_{m,B}$ are the measured overlays using the measurement parameter set A and measurement parameter set B respectively, and $\xi_{SD,A}$ and $\xi_{SD,B}$ are the relationship functions for the first and second periodic structures 1201, 1206 in accordance with the measurement parameter set A and the measurement parameter set B, respectively. $SD_A$ and $SD_B$ are calculated stack difference parameters based on the measurement of $I_{\pm 1}(\pm d)$ using the measurement parameter set A and the measurement parameter set B respectively. Further, $\Delta OV$ is the difference between the measured overlay with the measurement parameter set A, $OV_{m,A}$, and the measured overlay with the measurement parameter set B, $OV_{m,B}$. Measurement parameter sets A and B can differ in, e.g., wavelength and/or polarization of the measurement radiation.

Accordingly, where the stack difference parameter is or comprises periodic structure intensity imbalance GI, equation (27) becomes:

$$OV_{m,A} - OV = \xi_{SD,A} * GI_A$$

$$OV_{m,B} - OV = \xi_{SD,B} * GI_B$$

$$\Delta OV = OV_{m,A} - OV_{m,B} = \xi_{SD,A} * GI_A - \xi_{SD,B} * GI_B \quad (28)$$

where $GI_A$ and $GI_B$ are calculated according to equation (22) based on the measurement of $I_{\pm 1}(\pm d)$ using the measurement parameter set A and the measurement parameter set B respectively.

Thus, in an embodiment, the relationship function $\xi_{SD}$ can be found by determining the relationship between the calculated stack difference parameter using measurement parameter set A, $SD_A$ (e.g., $GI_A$), the calculated stack difference parameter using measurement parameter set B, $SD_B$ (e.g., $GI_B$), and the difference in overlay measurements $\Delta OV$ between measurement parameter sets A and B. Using $\xi_{SD}$ the overlay OV can be determined from equation (28).

Now, as discussed above, metrology targets can have a stack difference that affects the parameter (e.g., overlay) that can be determined using their measurement. Many processes during device fabrication, such as chemical mechanical polishing (CMP), film deposition, spin-coating, etc., can cause the stack difference (as well as structural asymmetry as discussed above). The stack difference can include a sidewall angle difference, a thickness asymmetry difference, a critical dimension difference, an over etching difference, etc. The stack difference can severely impact the accuracy of overlay measurement (e.g., up to several nanometers) because the process induced stack difference (and structural asymmetry) can be misread as a shift (in overlay) by the metrology tool, which will degrade overlay accuracy.

Figure 12:
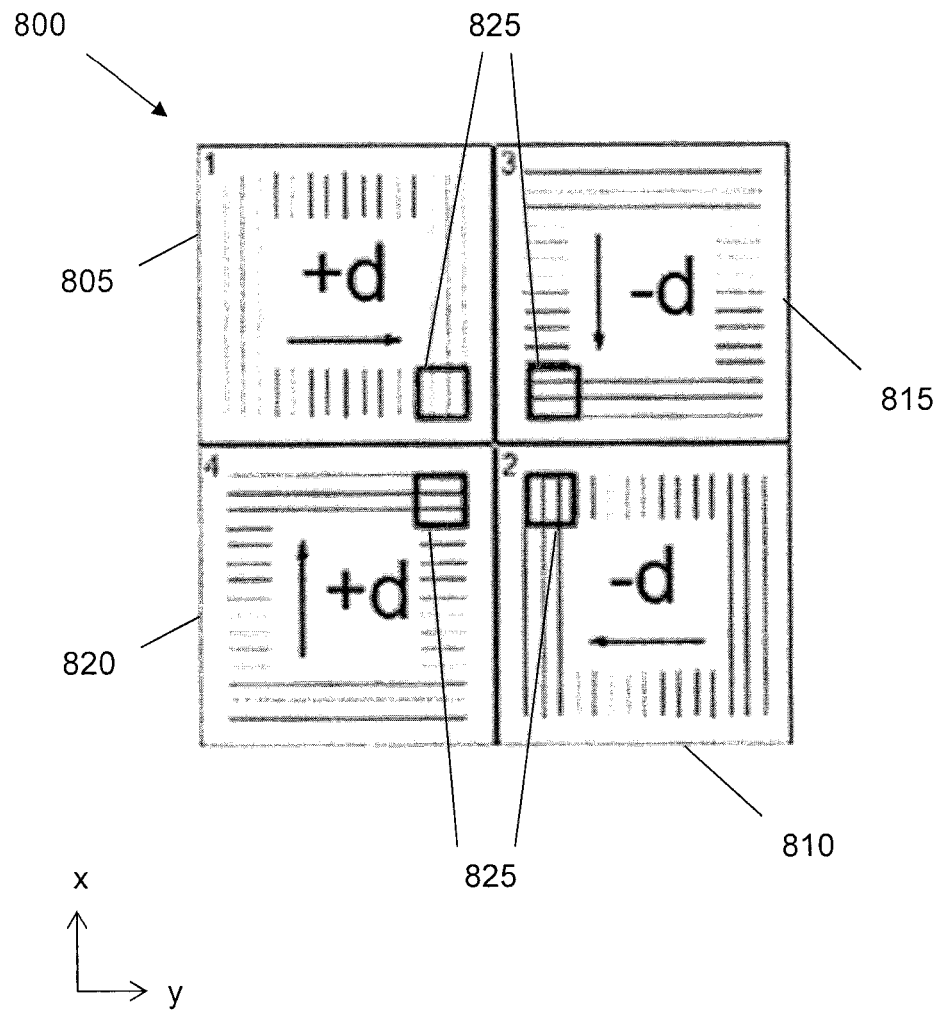
FIG. 12 depicts an example metrology target.

An example diffraction-based metrology target that can have stack difference is depicted in FIG. 12. The metrology target in this case is for determining an overlay parameter. FIG. 12 can have different forms and be measured to determine one or more different parameters than overlay and the discussion here is not limited to a metrology target of the form shown in FIG. 12 or of determining overlay.

Referring to FIG. 12, the example metrology target comprises a plurality of periodic structures (e.g., gratings) 805, 810, 815, 820. As is known, for overlay measurement, another comparable metrology target would be provided in a layer above or below the metrology target shown in FIG. 12. The periodic structures of that other metrology target would overlap those shown in FIG. 12 so that the misalignment between those other periodic structures and the periodic structures of FIG. 12 would provide a measure of overlay error.

In FIG. 12, symmetry periodic structures 805 and 810 are designed to measure overlay in they direction, while symmetric periodic structure 815 and 820 are designed to measure overlay in the x direction. In an embodiment, the two different sets of periodic structures are not required; just one set (e.g., 805 and 810 or 815 and 820) could be provided. Further, a set of the periodic structures have an intentional opposite bias as discussed above. In this case, the periodic structure 805 of the set of periodic structure 805 and 810 has a +d bias while periodic structure 810 of that set has a −d bias. Similarly, the periodic structure 815 of the set of periodic structure 815 and 820 has a −d bias while periodic structure 820 of that set has a +d bias. The bias amount need not be equal.

A stack difference can be created across a target such as depicted in FIG. 12. For example, there can be differences between the +d and −d regions of the set of periodic structures used to determine overlay in a particular direction (e.g., a stack difference between periodic structures 805 and 810 and/or between periodic structure 815 and 820). Thus, the stack difference can impact the overlay determined from the intensity measurements obtained when those periodic structures are illuminated with a measurement beam.

Accordingly, there is provided a solution to mitigate this impact by selecting a robust metrology target measurement recipe and/or calculating overlay by correcting stack difference induced overlay error. The solution can enable an improvement in overlay metrology for better speed, accuracy and/or precision.

For overlay determination, the stack difference can be characterized by a stack difference parameter such as periodic structure intensity imbalance GI. In an embodiment, the periodic structure intensity imbalance GI can be the $1^{st}$ order intensity difference between the +/−d periodic structures.

Figure 13:
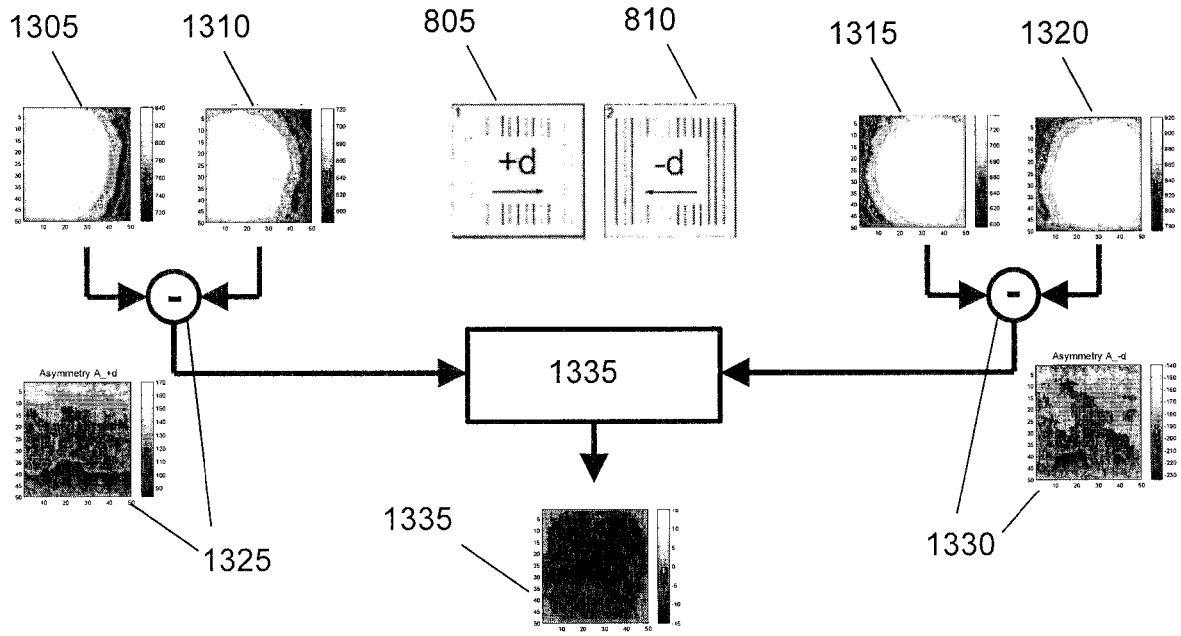
FIG. 13 depicts an example determination of overlay per pixel from a measured a region of interest (ROI) of a metrology target.

Referring to FIG. 13, an example of determining overlay is depicted using a set of periodic structures. In this example, the overlay is determined by actual measurement. However, the overlay can additionally or alternatively be determined using a simulation that simulates the optical process of how a metrology target is measured using a measurement beam. In an embodiment, the simulation process can account for the stack difference by, for example, introducing values corresponding to the stack difference determined by a separate determination of the stack difference (e.g., by scanning electron microscope inspection of one or more metrology targets to identify the stack difference). In an embodiment, the simulation process can account for the stack difference by, for example, perturbing values to effectively artificially create a stack difference (which perturbation could be constrained or guided by patterning process information). Such perturbation may be useful for determining a metrology target measurement recipe robust to one or more stack differences.

In the example of FIG. 13, the set of periodic structures 805 and 810 (with opposite bias +d and −d) are illuminated with a measurement beam. The periodic structures 805 and 810 are measured using a diffraction-based measurement tool that derives overlay from intensity measurements using image plane detection. The image plane detection enables the full periodic structure to be profiled. Therefore, the overlay can be determined at each pixel within a region of interest (ROI) to form an intra-target overlay map. An example of this is shown in FIG. 13. An intensity measurement of the $-1^{st}$ order radiation of the periodic structure 805 is shown at 1305 and an intensity measurement of the $+1^{st}$ order radiation of the periodic structure 805 is shown at 1310. Further, an intensity measurement of the $-1^{st}$ order radiation of the periodic structure 810 is shown at 1315 and an intensity measurement of the $+1^{st}$ order radiation of the periodic structure 810 is shown at 1320. At each of 1305, 1310, 1315 and 1320, an example graph of intensity value at each pixel of a ROI is depicted, wherein the grayscale shows the level of intensity. As will be appreciated, a graph need not be created. It is shown for explanation purposes. Then, a difference between a pixel of 1305 and a pixel of 1310 yields a pixel-level intensity asymmetry value $A_{+d}$ for each combination of pixel from 1305 and 1310 as depicted at 1325 and a difference between a pixel of 1315 and a pixel of 1320 yields a pixel-level intensity asymmetry value $A_{-d}$ for each combination of pixel from 1315 and 1320 as depicted at 1330. Then, overlay at each pixel can be determined at 1335, e.g., using $$OV = d \times \frac{A_{+d} + A_{-d}}{A_{+d} - A_{-d}},$$

equation (2), etc. for each pixel.

Figure 14:
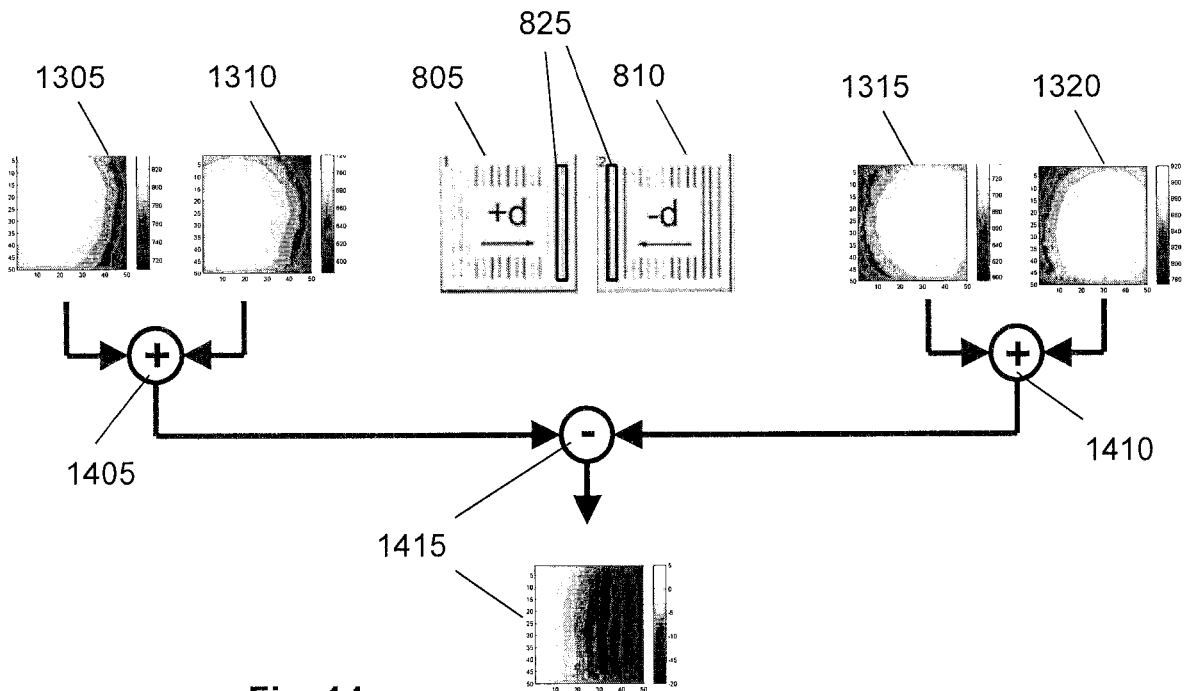
FIG. 14 depicts an example determination of stack difference per pixel from a measured a region of interest (ROI) of a metrology target.

Now, the stack difference parameter GI can be calculated at the pixel level in a similar manner as overlay was determined in FIG. 13. Referring to FIG. 14, using the intensity measurement 1305 of the $-1^{st}$ order radiation of the periodic structure 805, the intensity measurement 1310 of the $+1^{st}$ order radiation of the periodic structure 805, the intensity measurement 1315 of the $-1^{st}$ order radiation of the periodic structure 810, and the intensity measurement 1320 of the $+1^{st}$ order radiation of the periodic structure 810, the stack difference parameter GI can be computed for each pixel at 1415. As input to the stack difference parameter GI calculation at 1415, a combination of the intensity measurement 1305 of the $-1^{st}$ order radiation of the periodic structure 805 and the intensity measurement 1310 of the $+1^{st}$ order radiation of the periodic structure 805 is computed at 1405. Further, a combination of the intensity measurement 1315 of the $-1^{st}$ order radiation of the periodic structure 810 and the intensity measurement 1320 of the $+1^{st}$ order radiation of the periodic structure 810 is computed at 1410. In an embodiment, the combination at 1405, 1410 is a total intensity of the respective pixels, an average of the intensity of the respective pixels, etc. Then, the stack difference parameter GI at each pixel can be determined at 1415. In an embodiment, the stack difference parameter GI is a difference at each pixel between the values computed at 1405, 1410. In an embodiment, the stack difference parameter GI is calculated according to equation (22) or any other stack difference parameter formulations herein. At 1415, an example graph of the value of a stack difference parameter GI at each pixel of a ROI is depicted, wherein the grayscale shows the value level of the stack difference parameter GI. As will be appreciated, a graph need not be created. It is shown for explanation purposes.

Figure 15:
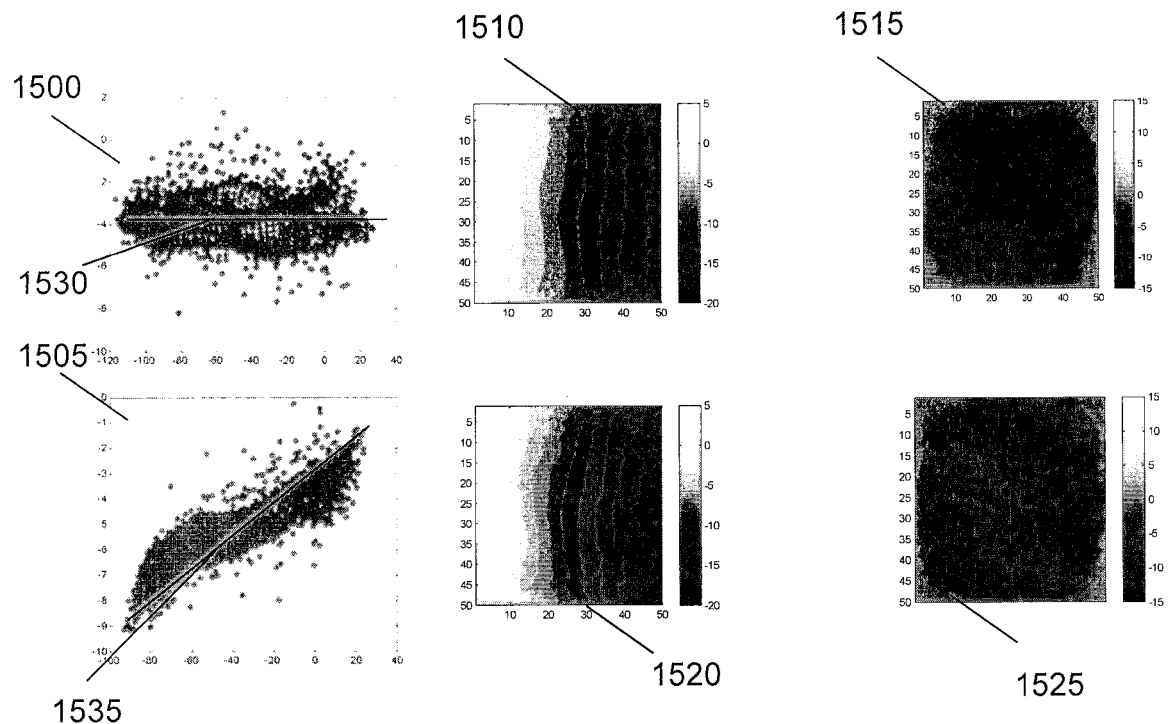
FIG. 15 depicts examples of overlay variation as stack difference varies.
Figure 16A:
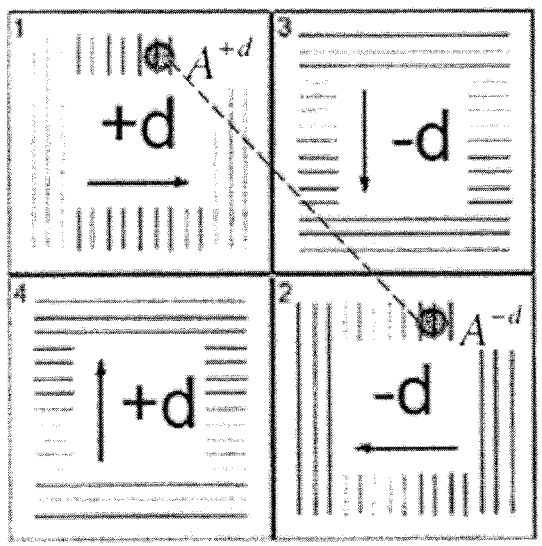
FIG. 16A and FIG. 16B depict examples of locations from which stack difference is calculated.

With 'intra-target' overlay and stack difference parameter GI data from the pixels in a ROI, the impact of the stack difference on overlay can be evaluated by determining how overlay per pixel varies as stack difference parameter GI per pixel varies across the ROI. Any dependence of overlay on the stack difference parameter GI within the metrology target can cause overlay error, deteriorating measurement accuracy. As illustrated in FIG. 15, different metrology target measurement recipes can realize different dependencies of overlay on the stack difference parameter GI and thus can produce different overlay results. At 1510, an example of stack difference parameter GI data for a ROI is depicted (i.e., comparable to data at 1415). Then at 1515, an example of respective overlay data for the ROI is depicted (i.e., comparable to data at 1335). This data corresponds to a particular metrology target at a particular measurement beam wavelength and polarization (e.g., at 600 nm and 0° polarization). Using the data 1510 and 1515, the variation of OV as the stack difference parameter GI varies is computed. An example of this shown at 1500, where the horizontal axis is stack difference parameter GI and the vertical axis is overlay. Each of the data points corresponds to the stack difference parameter GI and overlay data for particular combinations of pixels from the stack difference parameter GI and overlay data. In an embodiment, the pixels compared are the comparable pixels in each of 1510, 1515. An example of comparable pixels are shown in FIG. 16A, wherein $A^{+d}$ (e.g., $I_{+1}^{+d} - I_{-1}^{+d}$) for a pixel in periodic structure 1 is calculated with $A^{-d}$ (e.g., $I_{+1}^{-d} - I_{-1}^{-d}$) for a pixel in periodic structure 2 located at a comparable location. That is, for example, the data from the $1^{st}$ pixel in the first row at the upper left corner of each of 1510, 1515 corresponds to a data point in 1500, then the $2^{nd}$ pixel in the first row and so on. An example of this presented as 1500.

Similarly, at 1520, an example of stack difference parameter GI data for a ROI is depicted (i.e., comparable to data at 1415). Then at 1525, an example of respective overlay data for the ROI is depicted (i.e., comparable to data at 1335). This data corresponds to the same metrology target and measurement polarization, but at a different measurement beam wavelength (e.g., at 550 nm), than that for 1510 and 1515. Using the data 1520 and 1525, the variation of OV as the stack difference parameter GI varies is computed. An example of this shown at 1505, where the horizontal axis is stack difference parameter GI and the vertical axis is overlay.

Figure 16B:
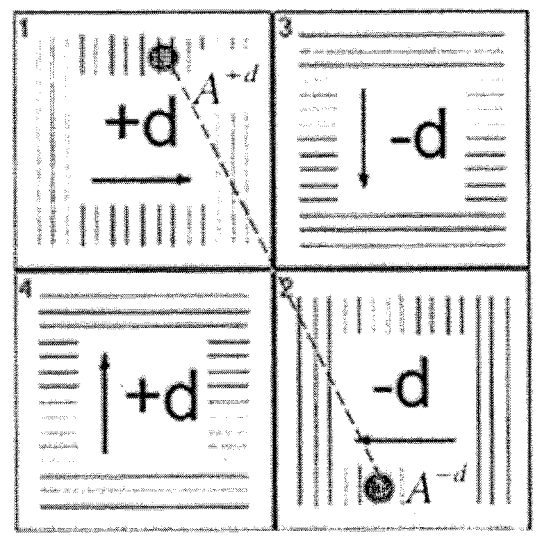

Each of the data points corresponds to the stack difference parameter GI and overlay data for particular combinations of pixels from the +d target data (e.g., data 1325, 1405) and the −d target data (e.g., data 1330, 1410). In an embodiment, the pixels processed are the comparable pixels in +d and −d target data. That is, for example, the $1^{st}$ pixel in the first row at the upper left corner of data 1325, 1405, 1330, 1410 is used for the respective calculation, then the $2^{nd}$ pixel in the first row and so on. But, a process can produce various different profiles of stack difference between the +/−d target regions, such as a gradient in stack difference parameter values across the +/−d target regions, a bump in stack difference parameter values with an opposite shift in the +d target region compared to the −d target region, a bump in stack difference parameter values with a same shift in the +/−d target regions, etc. So, with the pixel-level intensity measurement data, it is desirable to address the many possible types of stack difference. This can be done by creating numerous possible stack difference parameter GI profiles by changing how the pixel data from the +d target region is matched with pixel data from the −d target region, e.g. with different symmetries (translation, rotation, reflection etc.). So, in an embodiment, one or more other or further combinations between data in 1325 and 1330 are used. For example, in an embodiment, there is rotation symmetry between the +/−d target region data for the stack difference parameter GI calculation. An example of this is presented in FIG. 16B. For example, $A^{+d}$ (e.g., $I_{+1}^{+d} - I_{-1}^{+d}$) for a pixel in periodic structure 1 can be compared to $A^{-d}$ (e.g., $I_{+1}^{-d} - I_{-1}^{-d}$) for a pixel in periodic structure 2 located at 180° around the center of the ROI. In an embodiment, each pixel in 1325 can be compared against each pixel in 1330. So, in an embodiment, by changing how +d target pixel data is matched with −d target pixel data, various possible stack difference parameter GI scenarios can be created and evaluated without having to have such scenarios be physically created and measured.

Using the data of 1500 and 1505, a line/curve fit is performed. In the data 1500, the line/curve 1530 shows that the overlay is quite stable with varying stack difference parameter GI. In contrast, in the data 1505, the line/curve 1535 shows that the overlay varies quite significantly with varying stack difference parameter GI. This is despite that the data 1510 seems quite comparable to the data 1520 and the data 1515 seems quite comparable to the data 1525.

So, the slope of the fit between overlay per pixel and stack difference parameter GI per pixel provides an indicator for the stack difference impact on overlay. The closer the slope is to 0 the more the overlay is stable with respect to varying stack difference parameter GI. Thus, a metrology target measurement recipe with a slope closer to, or equal to, 0 indicates that it is stable to stack difference parameter GI variation (which can be, as discussed below, used to distinguish a better metrology target measurement recipe from another metrology target measurement recipe with a slope further from 0).

Further, particularly with taking numerous combinations of +d target region pixel data matched with −d target region pixel data (e.g., data from comparable locations and data from locations with rotational symmetry, data from locations with one type of symmetry and from locations with another type of symmetry, comparison of data from each pixel in +d target region with each pixel in the −d target region, etc.), the overlay at stack difference parameter GI of zero can be evaluated as a measure of the stack difference free overlay. For example, the values of overlay at stack difference parameter GI of zero can be averaged to give stack difference free overlay.

Moreover, by relating the stack difference parameter GI to the surrounding structures with a target, it is found that a stack difference parameter GI can be dependent on the location of the target on a substrate. The layout or pattern density of the surroundings of the target will impact the stack difference parameter GI of a target. However, the slope of overlay to the stack difference parameter GI across a ROI of a target shows little dependence on the location of the target on the substrate. It depends more on the metrology target measurement recipe, which makes it a good performance indicator to identify potential stack difference and/or inaccuracy issues compared to, e.g., mean of the stack difference parameter GI across a substrate.

In an embodiment, the slope of the fit can be used for various purposes. For example, the slope of the fit can be used a run-time indicator of the impact of stack difference on overlay. For example, if the slope meets or crosses a threshold, the measurement results can be discarded, further metrology using the particular metrology target measurement recipe can be stopped, the metrology target measurement recipe can be reconfigured, etc.

As a further example, the slope of the fit can be used in metrology target measurement recipe design and selection to rule out metrology target measurement recipes that are sensitive to stack difference and desirably select one or more metrology target measurement recipes for use in productive measurement that are insensitive, or have low sensitivity, to stack difference to help ensure good measurement accuracy. As discussed above, various combinations of how the pixel data from the +d target region is matched with pixel data from the −d target region can be evaluated to determine how overlay as determined using a particular metrology target measurement recipe responds to different types of stack difference profile. Desirably, a robust metrology target measurement recipe should show a stable overlay, no matter how the pixels between +/−d target regions are permuted.

Further, it has been discovered that non-zero overlay can induce a value of periodic structure intensity imbalance GI. This overlay induced periodic structure intensity imbalance $GI_{overlay}$ does not impact overlay accuracy. But, the overlay induced periodic structure intensity imbalance $GI_{overlay}$ can complicate determination of a stack difference parameter $GI_{stack}$ (e.g., a periodic structure intensity imbalance that is due to the stack difference and that negatively impacts overlay determination). So, in order to estimate overlay error caused by the non-overlay induced stack difference parameter $GI_{stack}$, the periodic structure intensity imbalance $GI_{overlay}$ is removed from the total periodic structure intensity imbalance $GI_{total}$. When the stack difference parameter GI from stack variation (i.e., $GI_{stack}$) is a dominant factor impacting overlay accuracy, the total periodic structure intensity imbalance $GI_{total}$ can be approximated as $GI_{overlay}$+$GI_{stack}$, where $GI_{total}$ is the mean periodic structure intensity imbalance GI across the target (which can be determined as described above across the target and then averaged), $GI_{overlay}$ is the overlay induced periodic structure intensity imbalance GI across the target, and $GI_{stack}$ is the stack difference periodic structure intensity imbalance due to stack variation, assuming they are independent of each other.

To arrive at periodic structure intensity imbalance $GI_{overlay}$, a certain part of the metrology target can be considered to have the least periodic structure intensity imbalance GI caused by stack variation. In an embodiment, the part is a location of a −d target region that is essentially closest to a +d target region used in calculating periodic structure intensity imbalance GI, or vice versa. In an embodiment, essentially closest is within ±10% or within ±20%, of the shortest distance between the periodic structure of the −d target region and the periodic structure of the +d target region. In an embodiment, the periodic structure intensity imbalance GI is calculated from intensity measured from the essentially closest regions of the +d target region and the −d target region. In an embodiment, data from regions of 10 or more, 15 or more, 20 or more, 25 or more (e.g., 5×5 pixels region), 30 or more, or 40 or more pixels is used to extract periodic structure intensity imbalance $GI_{overlay}$. In an embodiment, examples of the part considered to have the least periodic structure intensity imbalance GI caused by stack variation are shown in FIG. 12 as locations 825. In an embodiment, further examples of the part considered to have the least periodic structure intensity imbalance GI caused by stack variation are shown in FIG. 14 as locations 825. Inner regions (e.g., sides, corners) of the periodic structures of the metrology target should have the least periodic structure intensity imbalance caused by stack variation, since they are the areas where −d/+d diffracted radiation gets the closest to each other and where the least stack variation is expected from typical post-lithographic transfer patterning processes. So, the periodic structure intensity imbalance GI from an inner region should be mostly from overlay, and so the periodic structure intensity imbalance GI calculated for that part can be approximated as periodic structure intensity imbalance $GI_{overlay}$. Then, the stack difference periodic structure intensity imbalance $GI_{stack}$ will be $GI_{total}$−$GI_{overlay}$. The overlay error caused by the stack difference can then be estimated by using the slope of overlay versus stack difference parameter GI described above multiplied by stack difference parameter $GI_{stack}$. That is, with estimated $GI_{stack}$ and the slope between overlay and stack difference parameter GI per pixel, overlay error caused by stack difference per metrology target location can be estimated.

From studies, an average field fingerprint of a stack difference parameter $GI_{stack}$ across a substrate shows a similar trend as the total periodic structure intensity imbalance GI at a field at the center of the substrate, where the overlay is the lowest and where the contribution of periodic structure intensity imbalance $GI_{overlay}$ is at minimum. This shows that periodic structure intensity imbalance $GI_{overlay}$ can be separated from stack difference parameter $GI_{stack}$.

Figure 17:
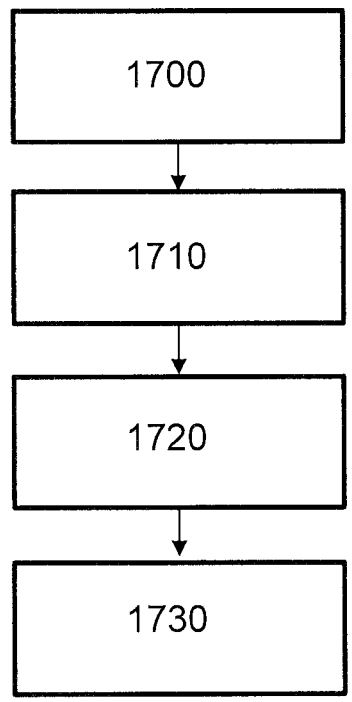
FIG. 17 is a flowchart of steps of a method according to an embodiment.

Additionally or in the alternative, periodic structure intensity imbalance $GI_{overlay}$ can be used as a reference in a different overlay error correction method described hereafter, since over correction may occur if there is correction to zero periodic structure intensity imbalance GI. So, in an embodiment, overlay accuracy can be improved by calculating overlay with a stack difference correction, i.e., by correcting stack difference-induced overlay error using periodic structure intensity imbalance $GI_{overlay}$ as a reference. An embodiment of this method is described in respect of FIG. 17.

At 1700, intensity data $A^{+d}$ (e.g., $I_{+1}^{+d}-I_{-1}^{+d}$) and $A^{-d}$ (e.g., $I_{+1}^{-d}-I_{-1}^{-d}$) for all pixels in a ROI is obtained, e.g., via image plane detection. A stack difference parameter GI is then calculated for each pixel. The stack difference parameter GI can be calculated as follows:

$$GI = \frac{(I_{+1}^{+d} + I_{-1}^{+d})}{2} - \frac{(I_{+1}^{-d} + I_{-1}^{-d})}{2} \qquad (29)$$

The stack difference parameter GI can be calculated in different ways. For example, the respective ROIs for the +d target region and the −d target region can have non-rotational symmetry. An example of this was described above with respect to FIG. 16A. As another example, the ROI for the −d target region can have a rotation symmetry with respect to the +d target region ROI. An example of this was described above with respect to FIG. 16B. In an embodiment, rotation symmetry between +/−d target data is used for the stack difference parameter GI calculation since with rotation symmetry, stack difference parameter GI from intensity measured from the essentially closest regions of the +d target region and the −d target region (e.g. shown in FIG. 12 as locations 825) can be calculated to approximate periodic structure intensity imbalance $GI_{overlay}$. However, different symmetric operations (and non-symmetric operations) can be possible for calculating the stack difference parameter GI.

Figure 18:
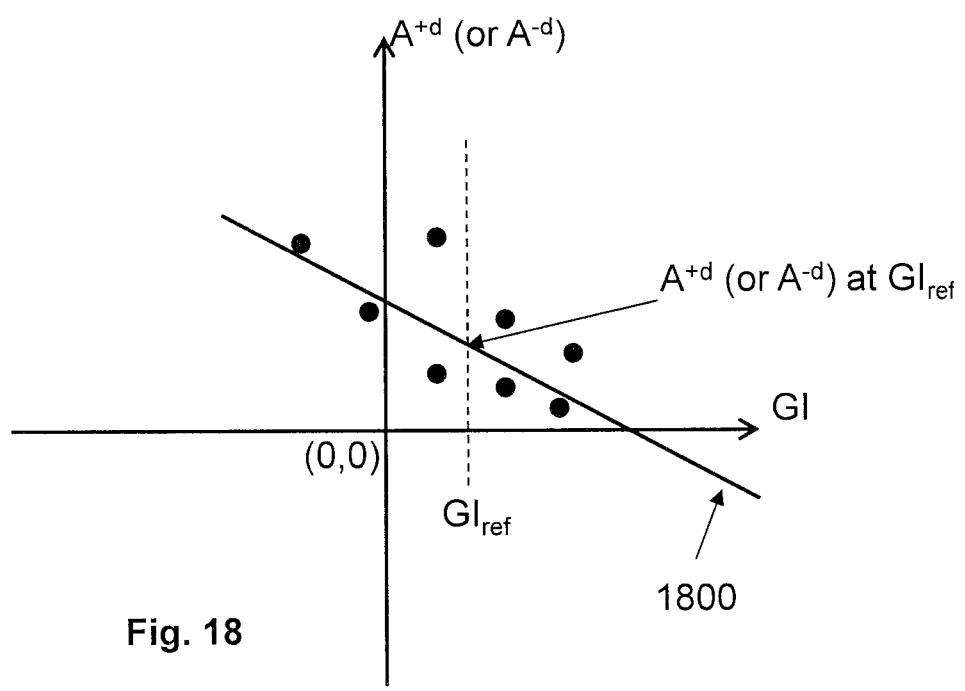
FIG. 18 depicts an example graph of variation of intensity difference as a function of variation of stack difference and identification of a particular intensity difference value.

At 1710, $A^{+d}$ and $A^{-d}$ are evaluated (e.g., plotted) as a function of stack difference parameter GI using valid pixel data. Pixel data is valid if the data for the pixel is not unusual compared to the rest of the data. For example, pixel data beyond mean±2 standard deviations, or mean±3 standard deviations, of the ROI data could be ignored. An example plot of $A^{+d}$ or $A^{-d}$ as a function of stack difference parameter GI is presented in FIG. 18. A plot is obtained for $A^{+d}$ as a function of stack difference parameter GI and another plot is obtained for $A^{-d}$ as a function of stack difference parameter GI. Of course, actual plots are not necessary as the data alone can be evaluated without its plotting.

At 1720, $A^{+d}$ and $A^{-d}$ values are obtained at the reference stack difference parameter $GI_{ref}=GI_{overlay}$. To enable this, a fit can determined for the data of $A^{+d}$ and $A^{-d}$ as a function of stack difference parameter GI. In an embodiment, the fit is a linear fit. An example of a linear fit is shown as 1800 in FIG. 18. Then, for example, corrected intensity asymmetry $A^{+d}$ and $A^{-d}$ values are obtained from the fit at stack difference parameter $GI_{ref}=GI_{overlay}$, as shown, for example, in FIG. 18. In an embodiment, the corrected intensity asymmetry $A^{+d}$ and $A^{-d}$ values are respectively a statistical average of the respective $A^{+d}$ and $A^{-d}$ values having the stack difference parameter $GI_{ref}=GI_{overlay}$.

Direct interpolation of overlay with a linear fit of data of overlay as a function of stack difference parameter GI may not be as effective as interpolation of $A^{+d}$ and $A^{-d}$ values at a reference stack difference parameter $GI_{ref}=GI_{overlay}$. This is because overlay is not a simple linear function of stack difference parameter GI; however $A^{+d}$ and $A^{-d}$ and stack difference parameter GI can be linear functions of intensity.

At 1730, the corrected $A^{+d}$ and $A^{-d}$ values at stack difference parameter $GI_{ref}$ are used for overlay calculation to yield a stack difference corrected overlay. An example form of equation for calculating overlay OV is as follows:

$$OV = \frac{P}{2\pi}\tan^{-1}\left[\left(\frac{A^{+d} + A^{-d}}{A^{+d} - A^{-d}}\right)\tan\left(\frac{2\pi d}{P}\right)\right] \qquad (30)$$

wherein d is bias of the periodic structures and P is pitch of the features of the periodic structures. So, by using $A^{+d}$ and $A^{-d}$ values at stack difference parameter $GI_{ref}=GI_{overlay}$, the impact of stack difference on overlay accuracy can be reduced or eliminated.

Because a limited number of pixels are used to extract periodic structure intensity imbalance $GI_{overlay}$, it may be noisy, which can make overlay error correction less effective. The stack difference parameter $GI_{stack}$ often has a strong intrafield fingerprint (i.e., a particular fingerprint of values within a field on the substrate), determined by the layout/pattern density of the structure surrounding the metrology target. This structure does not change significantly across the fields of a substrate or among the fields of a plurality of substrates of a particular patterning process. So, in order to have more effective correction, more fields of a substrate, or a plurality of substrates, can be sampled to obtain periodic structure intensity imbalance $GI_{overlay}$. By using an averaged field periodic structure intensity imbalance $GI_{overlay}$, a more accurate stack difference parameter $GI_{stack}$ can be obtained at each target position across the substrate, which will result in $A^{+d}$ and $A^{-d}$ values with better accuracy in the procedures above.

Slight changes in substrate processing will lead to overlay variation, thereby impacting, for example, the overlay control loop APC (Automatic Process Control) and the device yield. Thus, in an embodiment, it would be desirable to optimize selection of the metrology target measurement recipe in view of stack difference so as to obtain more accurate overlay error measurements, or to remove the overlay contribution due to stack difference, thereby correcting the overlay error measurements.

So, there is disclosed a method of identifying one or more desirable metrology target measurement recipes. Once identified, the metrology target measurement recipe can be used in performing overlay measurements.

It should be noted that one or more desirable metrology target measurement recipes will tend to correspond to a particular metrology target design, such that a desirable combination of metrology target design and one or more measurement characteristics is identified. But, a particular metrology target design will not necessarily provide good results for all measurement characteristics, and one or more measurement characteristics will not necessarily provide good results for all metrology target designs. So, it is desirable to find a metrology target measurement recipe.

Metrology target designs may be varied in a number of ways. There may be variation in one or more parameters such as critical dimension, sidewall angle, pitch, etc. A number of candidate metrology target designs may be evaluated, each showing variation in one or more of these parameters. Similarly, measurement characteristics may be varied in terms of parameters such as wavelength and/or polarization. So, a plurality of metrology target measurement recipes may be evaluated, each recipe showing variation in one or more of these parameters.

Figure 19:
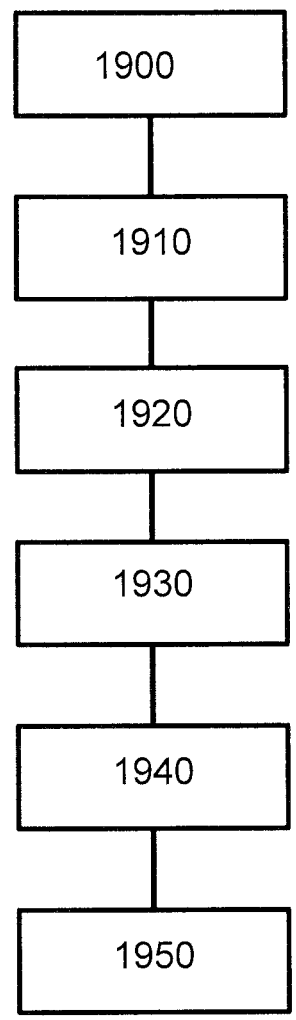
FIG. 19 is a flowchart of steps of a method according to an embodiment.

FIG. 19 is a flowchart of a method of metrology target measurement recipes selection according to an exemplary embodiment. At 1900, measurement radiation intensity values for a first metrology target measurement recipe and overlay and stack difference parameter values are determined from the measurement radiation intensity values. At

1910, a slope of a fit of data of overlay as a function of stack difference parameter for a metrology target measurement recipe is determined. At 1920, the slope of the fit of the metrology target measurement recipe is compared with the slope of the fit of another, different metrology target measurement recipe. At 1930, which of the metrology target measurement recipes has a better slope of the fit is determined. For example, a metrology target measurement recipe with a slope closer to, or equal to, 0 indicates that it is stable to stack difference variation which can be used to distinguish a better metrology target measurement recipe from another metrology target measurement recipe with a slope further from 0. At 1940, optionally one or more further metrology target measurement recipes are evaluated in accordance with 1900-1930. At 1950, one or more desirable metrology target measurement recipes are output based on the analysis of the slope of the fit.

Figure 20:
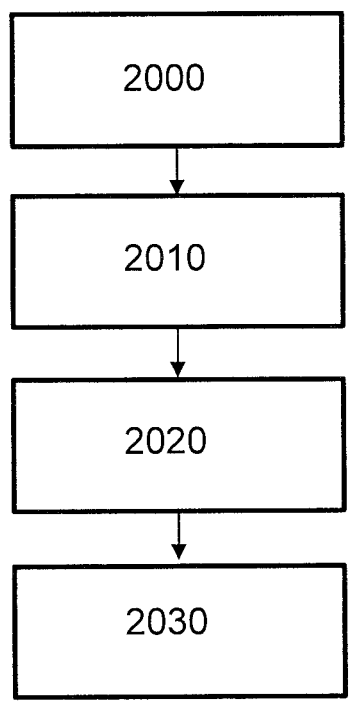
FIG. 20 is a flowchart illustrating a process in which a metrology target is used to monitor performance, and as a basis for controlling metrology, design and/or production processes.

FIG. 20 shows a flowchart illustrating a process in which a metrology target is used to monitor performance, and as a basis for controlling metrology, design and/or production processes. In step 2000, substrates are processed to produce product features and one or more metrology targets as described herein. At step 2010, patterning process parameter (e.g., overlay) values are measured and calculated using, e.g., the method of FIG. 6 and optionally, corrected using stack difference in accordance with a method described herein. At step 2020, the determined patterning process parameter (e.g., overlay) value may be used (together with other information as may be available), to update, change, etc. a metrology target measurement recipe. The updated, changed, etc. metrology target measurement recipe can be used for subsequent measurement of the patterning process parameter (e.g., for measurement of the patterning process parameter on a subsequently processed substrate). In this way, the calculated patterning process parameter can be improved in accuracy. The updating process can be automated if desired. In step 2030, the patterning process parameter value can be used to control, modify, design, etc. a lithographic patterning step/apparatus and/or other process step/apparatus in the patterning process for, e.g., re-work and/or for processing of further substrates. Again this updating can be automated if desired.

So, in an embodiment, periodic structure pixel level data from image plane detection is used to derive stack difference parameter values and use of those stack difference parameter values to, e.g., correction of overlay. In an embodiment, by changing how +d target pixel data is matched with −d target pixel data, various possible stack difference scenarios can be created and accordingly how they impact on overlay can be evaluated. In an embodiment, the slope of a fit of data for overlay as a function of a stack difference parameter within a metrology target is as a robustness and/or accuracy indicator for, for example, metrology target measurement recipe selection.

In an embodiment, overlay calculated using data at pixels where a +/−d target region is expected to have the least stack difference based on the metrology target type and layout can enable better overlay consistency between different metrology target measurement recipes, indicating a better overlay accuracy. In an embodiment, by using inner pixel data of a metrology target, overlay induced periodic structure intensity imbalance $GI_{overlay}$ can be separated from non-overlay induced periodic structure intensity imbalance $GI_{stack}$. With a stack difference parameter $GI_{stack}$ and the slope of the fit of data of overlay as a function of the stack difference parameter GI, overlay error caused by stack difference can be estimated.

In an embodiment, stack difference corrected overlay is obtained by making use of information of pixels within a ROI of a metrology target, obtaining a fit (e.g., a linear fit is effective) of data of intensity asymmetry values $A^{+d}$ and $A^{-d}$ as a function of a stack difference parameter GI, and extracting intensity asymmetry values $A^{+d}$ and $A^{-d}$ at a stack difference parameter $GI_{ref}=GI_{overlay}$. The extracted intensity asymmetry values $A^{+d}$ and $A^{-d}$ at $GI_{ref}=GI_{overlay}$ are used for a corrected overlay calculation. In an embodiment, the intensity asymmetry values $A^{+d}$ and $A^{-d}$ are determined by matching pixels from a +d target region that have rotation symmetry with pixels from a −d target region, which are then used in obtaining a mean intensity difference of +d and −d ROIs for use in calculating stack difference.

With the stack difference methods herein, improved overlay accuracy can be obtained. With the stack difference methods herein, within-field consistency can improved. With the stack difference methods herein, between metrology target measurement recipe similarity can be improved. So, the stack difference methods should open up more good settings for metrology target measurement recipe selection, which could make metrology qualification easier and/or faster.

In an embodiment, with the stack difference methods herein, the time to determining a metrology target measurement recipe can be shortened by filtering stack difference sensitive metrology target measurement recipes. For example, the stack difference methods herein can potentially reduce the number of iterations of metrology target measurement recipes considered. In an embodiment, with the stack difference methods herein, a more robust metrology target measurement recipe can be identified.

One or more of the following are features can be made possible by the concepts described herein: use of stack difference for correction of overlay error measurements in inline measurement; more accurate overlay measurements can be obtained from overlay and stack difference determinations; process-robust metrology target measurement recipes can be identified using stack difference; and/or a desirable metrology target measurement recipe can be determined from a calculated stack difference parameter.

The methods described herein may require no new reticle design, no change in metrology design and/or no increase in metrology target real-estate. The methods are also capable of broader application, for example, the stack difference can be used for process stability monitoring.

While the embodiments have focused on $+1^{st}$ and $-1^{st}$ diffraction order radiation, other diffraction orders of radiation may be considered and processed.

While the embodiments disclosed above are described in terms of diffraction based overlay measurements (e.g., measurements made using the second measurement branch of the apparatus shown in FIG. 3A), in principle the same models can be used for pupil based overlay measurements (e.g., measurements made using the first measurement branch of the apparatus shown in FIG. 3A). Consequently, it should be appreciated that the concepts described herein are equally applicable to diffraction based overlay measurements and pupil based overlay measurements.

While embodiments of the metrology target described herein have mostly been described in the terms of overlay measurement, embodiments of the metrology target described herein may be used to measure one or more additional or alternative patterning process parameters. For example, the metrology target may be used to measure exposure dose variation, measure exposure focus/defocus, measure CD, etc. Further, the description here may also apply, with modifications as appropriate, to, e.g., substrate and/or patterning device alignment in a lithographic apparatus using an alignment mark. Similarly, the appropriate recipe for the alignment measurement may be determined.

In an embodiment, the intensity data for all suitable pixels in the region of interest are used for selecting measurement settings such as wavelength and polarization. For small overlay numbers, the intensity difference $\Delta I$ between the $+1^{st}$ and $-1^{st}$ diffraction orders is $$\Delta I = K \times OV,$$

wherein OV is the overlap and K is the overlay sensitivity which depends on the stack and measurement settings. The value of K can be calculated if $\Delta I$ and OV are determined as described above. The aim is to find measurement settings which correspond to large overlay sensitivity but with a small variation of the sensitivity across the region of interest. The variation can be expressed as $\sigma K$, which is the standard deviation of K across all valid pixels across the region of interest. The value of intra-target $\sigma K/K$ will indicate what the optimal measurement settings are. In addition to deriving intra-target $\sigma K/K$, the mean plus or minus three standard deviations of the intra-target $\sigma K/K$ across the whole wafer is calculated as a further indicator of robustness of the measurement settings. The inventors have realized that this calculation provides a better indication of the optimal measurement setting when compared to a calculation of across wafer $\sigma K/K$ which does not take into account the variation of K between pixels in a region of interest. Across wafer $\sigma K/K$ may lead to ambiguity between measurement settings and consequently poor measurement precision and overlay inaccuracy. Intra-target $\sigma K/K$ captures small scale local process variation within the region of interest. The dimensions of the variations are typically in the order of micrometers. The optimal measurement settings can be selected, which also provide optimal grating imbalance sensitivity. The determination of intra-target $\sigma K/K$ does not necessarily require dense sampling and a sparse sampling of around 200 points across the wafer can be sufficient.

While the target structures described above are metrology targets specifically designed and formed for the purposes of measurement, in other embodiments, properties may be measured on targets which are functional parts of devices formed on the substrate. Many devices have regular, periodic structures akin to a grating. The term "target", "grating" or "periodic structure" of a target as used herein does not require that the applicable structure has been provided specifically for the measurement being performed. Further, pitch P of the metrology target is close to the resolution limit of the optical system of the measurement tool, but may be much larger than the dimension of typical product features made by a patterning process in the target portions C. In practice the features and/or spaces of the periodic structures may be made to include smaller structures similar in dimension to the product features.

In association with the physical structures of the targets as realized on substrates and patterning devices, an embodiment may include a computer program containing one or more sequences of machine-readable instructions and/or functional data describing the target design, describing a method of designing a target for a substrate, describing a method of producing a target on a substrate, describing a method of measuring a target on a substrate and/or describing a method of analyzing a measurement to obtain information about a patterning process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing inspection apparatus, for example of the type shown in FIG. 3, is already in production and/or in use, an embodiment can be implemented by the provision of an updated computer program product for causing a processor to perform one or more of the methods described herein (e.g., calculate overlay error as described herein). The program may optionally be arranged to control the optical system, substrate support and the like to perform a method of measuring a parameter of the patterning process on a suitable plurality of targets (e.g., to measure for determining stack difference and/or structural asymmetry on a suitable plurality of targets and/or to determine overlay error). The program can update a parameter of the patterning process and/or of the metrology recipe, for measurement of further substrates. The program may be arranged to control (directly or indirectly) the lithographic apparatus for the patterning and processing of further substrates.

Further, embodiments have been described herein in relation to diffraction-based metrology, which, for example, measures the relative position of overlapping periodic structures from the intensity from the diffracted orders. However, embodiments herein may be applied, with appropriate modification where needed, to image-based metrology, which, for example, measures the relative position from target 1 in layer 1 to target 2 in layer 2 using high-quality images of the targets. Usually these targets are periodic structures or "boxes" (Box-in-Box (BiB)).

In an embodiment, there is provided a method comprising: obtaining a fit of data for overlay of a metrology target for a patterning process as a function of a stack difference parameter of the metrology target; and using, by a hardware computer, a slope of the fit (i) to differentiate a metrology target measurement recipe from another metrology target measurement recipe, or (ii) calculate a corrected value of overlay, or (iii) to indicate that an overlay measurement value obtained using the metrology target should be used, or not be used, to configure or modify an aspect of the patterning process, or (iv) any combination selected from (i)-(iii).

In an embodiment, the overlay and stack difference parameter data is calculated at pixel level of an image of the metrology target. In an embodiment, the overlay and stack difference parameter is calculated from image plane detection of the intensity of diffraction radiation measured from the metrology target. In an embodiment, the method further comprises deriving the overlay and/or stack difference parameter data using a combination of radiation intensity data for a first location of the image of a first periodic structure of the metrology target with radiation intensity data for a second location of the image of a second periodic structure of the metrology target, wherein the second location is at a rotationally symmetric position to the first location. In an embodiment, the stack difference parameter comprises a combination of intensity values of periodic structures of the metrology target having a first bias value minus a combination of intensity values of periodic structures of the metrology target having a second different bias value. In an embodiment, the fit is a linear fit. In an embodiment, the method comprises using the slope of the fit to calculate a corrected value of overlay. In an embodiment, the method comprises using the slope of the fit to differentiate a metrology target measurement recipe from another metrology target measurement recipe. In an embodiment, the method comprises configuring or modifying an aspect of the patterning process based on the slope of the fit.

In an embodiment, there is provided a method comprising: obtaining a periodic structure intensity imbalance parameter value for a region of a metrology target of a patterning process, the region expected to have least stack difference; finding a non-overlay induced periodic structure intensity imbalance parameter value as a difference between an average periodic structure intensity imbalance parameter value for the metrology target and the periodic structure intensity imbalance parameter value for the region; and using the non-overlay induced periodic structure intensity imbalance parameter difference to calculate a corrected overlay value.

In an embodiment, the method further comprises combining the non-overlay induced periodic structure intensity imbalance parameter difference with a slope of a fit of data for overlay of the metrology target as a function of the stack difference induced periodic structure intensity imbalance parameter of the metrology target, to calculate the corrected overlay value. In an embodiment, the region is a location within a first periodic structure of the metrology target and a distance from the region to a second periodic structure of the metrology target having a second different bias is between 90% to 110% of the shortest distance between the first periodic structure and the second periodic structure. In an embodiment, the method further comprises deriving the periodic structure intensity imbalance parameter of the region using a combination of radiation intensity data for a first location of the image of a first periodic structure of the metrology target with radiation intensity data for a second location of the image of a second periodic structure of the metrology target, wherein the second location is at a rotationally symmetric position to the first location. In an embodiment, the periodic structure intensity imbalance parameter of the region comprises a combination of intensity values of periodic structures of the metrology target having a first bias value minus a combination of intensity values of periodic structures of the metrology target having a second different bias value. In an embodiment, the periodic structure intensity imbalance parameter data is calculated at pixel level of an image of the metrology target. In an embodiment, the periodic structure intensity imbalance parameter data is calculated from image plane detection of the intensity of diffraction radiation measured from the metrology target.

In an embodiment, there is provided a method comprising: obtaining measurement radiation intensity values for a metrology target of a patterning process as a function of a stack difference parameter of the metrology target; obtaining, from the measurement radiation intensity values as a function of the stack difference parameter, values of measurement radiation intensity for determining overlay at a value of non-overlay induced periodic structure intensity imbalance; and determining, by a hardware computer, a value of overlay based on the values of measurement radiation intensity for determining overlay.

In an embodiment, the measurement radiation intensity values comprise a difference between radiation intensity for a positive diffraction order and a negative diffraction order. In an embodiment, the method comprises determining the value of overlay based on the values of measurement radiation intensity for determining overlay, on a pitch of a periodic structure of the metrology target, and on a bias value for the periodic structure of the metrology target. In an embodiment, the values of measurement radiation intensity for determining overlay are determined from a fit through data of the measurement radiation intensity values as a function of the stack difference parameter. In an embodiment, the method further comprises deriving the stack difference parameter using a combination of radiation intensity data for a first location of the image of a first periodic structure of the metrology target with radiation intensity data for a second location of the image of a second periodic structure of the metrology target, wherein the second location is at a rotationally symmetric position to the first location. In an embodiment, the stack difference parameter comprises a combination of intensity values of periodic structures of the metrology target having a first bias value minus a combination of intensity values of periodic structures of the metrology target having a second different bias value. In an embodiment, the stack difference parameter data is calculated at pixel level of an image of the metrology target. In an embodiment, the stack difference parameter is calculated from image plane detection of the intensity of diffraction radiation measured from the metrology target.

In an embodiment, there is provided a metrology apparatus for measuring a parameter of a lithographic process, the metrology apparatus being operable to perform a method as described herein.

In an embodiment, there is provided a non-transitory computer program product comprising machine-readable instructions for causing a processor to cause performance of a method as described herein.

In an embodiment, there is provided a system comprising: an inspection apparatus configured to provide a beam of radiation on two adjacent periodic structures or measurement targets on a substrate and to detect radiation diffracted by the targets to determine a parameter of a patterning process; and a non-transitory computer program as described herein. In an embodiment, the system further comprises a lithographic apparatus comprising a support structure configured to hold a patterning device to modulate a radiation beam and a projection optical system arranged to project the modulated radiation beam onto a radiation-sensitive substrate.

The term "optimizing" and "optimization" as used herein mean adjusting an apparatus or process, e.g., a lithographic apparatus or an optical lithography process step, such that patterning and/or device fabrication results and/or processes (e.g., of lithography) have one or more desirable characteristics, such as higher accuracy of projection of a design layout on a substrate, larger process window, etc.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more aspects disclosed herein may be implanted in a control system. Any control system described herein may each or in combination be operable when the one or more computer programs are read by one or more computer processors located within at least one component of an apparatus. The control systems may each or in combination have any suitable configuration for receiving, processing, and sending signals. One or more processors are configured to communicate with the at least one of the control systems. For example, each control system may include one or more processors for executing the computer programs that include machine-readable instructions for the methods described above. The control systems may include data storage medium for storing such computer programs, and/or hardware to receive such medium. So the control system(s) may operate according the machine readable instructions of one or more computer programs.

Although specific reference may have been made above to the use of embodiments in the context of optical lithography, it will be appreciated that embodiments of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:
obtaining a fit of overlay and stack difference parameter data for overlay of a metrology target for a patterning process as a function of a stack difference parameter of the metrology target; and
using, by a hardware computer, a slope of the fit (i) to differentiate a metrology target measurement recipe from another metrology target measurement recipe, or (ii) calculate a corrected overlay value, or (iii) to indicate that an overlay measurement value obtained using the metrology target should be used, or not be used, to configure or modify an aspect of the patterning process, or (iv) any combination selected from (i)-(iii).

2. The method of claim 1, wherein the overlay and/or stack difference parameter data is calculated at pixel level of an image of the metrology target.

3. The method of claim 1, wherein the overlay and/or stack difference parameter data is calculated from an image plane detection of intensity of diffraction radiation measured from the metrology target.

4. The method of claim 1, further comprising deriving the overlay and/or stack difference parameter data using a combination of radiation intensity data for a first location of an image of a first periodic structure of the metrology target with radiation intensity data for a second location of an image of a second periodic structure of the metrology target, wherein the second location is at a rotationally symmetric position to the first location.

5. The method of claim 1, wherein the stack difference parameter comprises a combination of intensity values of periodic structures of the metrology target having a first bias value minus a combination of intensity values of periodic structures of the metrology target having a second bias value different from the first bias value.

6. The method of claim 1, wherein the fit is a linear fit.

7. The method of claim 1, comprising using the slope of the fit to calculate a corrected overlay value.

8. The method of claim 1, comprising using the slope of the fit to differentiate a metrology target measurement recipe from another metrology target measurement recipe.

9. The method of claim 1, comprising configuring or modifying an aspect of the patterning process based on the slope of the fit.

10. A method comprising:
obtaining a periodic structure intensity imbalance parameter value for a region of a metrology target of a patterning process, the region expected to have least stack difference;
finding a non-overlay induced periodic structure intensity imbalance parameter value as a difference between an average periodic structure intensity imbalance parameter value for the metrology target and the periodic structure intensity imbalance parameter value for the region; and
using, by a hardware computer, the non-overlay induced periodic structure intensity imbalance parameter value to calculate a corrected overlay value.

11. The method of claim 10, further comprising combining the non-overlay induced periodic structure intensity imbalance parameter value with a slope of a fit of data for overlay of the metrology target as a function of stack difference induced periodic structure intensity imbalance parameter of the metrology target, to calculate the corrected overlay value.

12. The method of claim 10, wherein the region is a location within a first periodic structure of the metrology target and a distance from the region to a second periodic structure of the metrology target having a second different bias is between 90% to 110% of a shortest distance between the first periodic structure and the second periodic structure.

13. The method of claim 10, further comprising deriving the periodic structure intensity imbalance parameter of the region using a combination of radiation intensity data for a first location of an image of a first periodic structure of the metrology target with radiation intensity data for a second location of an image of a second periodic structure of the metrology target, wherein the second location is at a rotationally symmetric position to the first location.

14. The method of claim 10, wherein the periodic structure intensity imbalance parameter of the region comprises a combination of intensity values of periodic structures of the metrology target having a first bias value minus a combination of intensity values of periodic structures of the metrology target having a second bias value different from the first bias value.

15. The method of claim 10; wherein the periodic structure intensity imbalance parameter value is calculated at pixel level of an image of the metrology target.

16. The method of claim 10, wherein the periodic structure intensity imbalance parameter value is calculated from an image plane detection of intensity of diffraction radiation measured from the metrology target.

17. A method comprising:
obtaining measurement radiation intensity values for a metrology target of a patterning process as a function of a stack difference parameter of the metrology target;
obtaining, from the measurement radiation intensity values as a function of the stack difference parameter, values of measurement radiation Intensity for determining overlay at a value of non-overlay induced periodic structure intensity imbalance; and
determining, by a hardware computer, a value of overlay based on the values of measurement radiation intensity for determining overlay.

18. The method of claim 17, wherein the measurement radiation intensity values comprise a difference between radiation intensity for a positive diffraction order and a negative diffraction order.

19. The method of claim 17, comprising determining the value of overlay based on the values of measurement radiation intensity for determining overlay, on a pitch of a periodic structure of the metrology target, and on a bias value for the periodic structure of the metrology target.

20. The method of claim 17, wherein the values of measurement radiation intensity for determining overlay are determined from a fit through data of the measurement radiation intensity values as a function of the stack difference parameter.

21. The method of claim 17, further comprising deriving the stack difference parameter using a combination of radiation intensity data for a first location of an image of a first periodic structure of the metrology target with radiation intensity data for a second location of an image of a second periodic structure of the metrology target, wherein the second location is at a rotationally symmetric position to the first location.

22. The method of claim 17, wherein the stack difference parameter comprises a combination of intensity values of periodic structures of the metrology target having a first bias value minus a combination of intensity values of periodic structures of the metrology target having a second bias value different from the first bias value.

23. The method of claim 17, wherein the stack difference parameter is calculated at pixel level of an image of the metrology target.

24. The method of claim 17, wherein the stack difference parameter is calculated from image plane detection of intensity of diffraction radiation measured from the metrology target.

25. A non-transitory computer program product comprising machine-readable instructions stored therein, the instructions, upon execution by a computer system, configured to cause the computer system to at least:
obtain a fit of overlay and stack difference parameter data for overlay of a metrology target for a patterning process as a function of a stack difference parameter of the metrology target; and
use a slope of the fit (i) to differentiate a metrology target measurement recipe from another metrology target measurement recipe, or (ii) calculate a corrected overlay value, or (iii) to indicate that an overlay measurement value obtained using the metrology target should be used, or not be used, to configure or modify an aspect of the patterning process, or (iv) any combination selected from (i)-(iii).

26. A non-transitory computer program product comprising machine-readable instructions stored therein, the instructions, upon execution by a computer system, configured to cause the computer system to at least:
obtain a periodic structure intensity imbalance parameter value for a region of a metrology target of a patterning process, the region expected to have least stack difference;
find a non-overlay induced periodic structure intensity imbalance parameter value as a difference between an average periodic structure intensity imbalance parameter value for the metrology target and the periodic structure intensity imbalance parameter value for the region; and
use the non-overlay induced periodic structure intensity imbalance parameter value to calculate a corrected overlay value.

27. A non-transitory computer program product comprising machine-readable instructions stored therein, the instructions, upon execution by a computer system, configured to cause the computer system to at least:
obtain measurement radiation intensity values for a metrology target of a patterning process as a function of a stack difference parameter of the metrology target;
obtain, from the measurement radiation intensity values as a function of the stack difference parameter, values of measurement radiation intensity for determining overlay at a value of non-overlay induced periodic structure intensity imbalance; and
determine a value of overlay based on the values of measurement radiation intensity for determining overlay.

* * * * *